(12) United States Patent
Lin et al.

(10) Patent No.: US 11,114,566 B2
(45) Date of Patent: Sep. 7, 2021

(54) SEMICONDUCTOR DEVICE AND METHOD OF MANUFACTURING THE SAME

(71) Applicant: TAIWAN SEMICONDUCTOR MANUFACTURING CO., LTD., Hsinchu (TW)

(72) Inventors: Zhi-Chang Lin, Hsinchu County (TW); Kai-Chieh Yang, Kaohsiung (TW); Chia-Wei Su, Taoyuan (TW); Jia-Ni Yu, New Taipei (TW); Wei-Hao Wu, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/033,256

(22) Filed: Jul. 12, 2018

(65) Prior Publication Data

US 2020/0020794 A1    Jan. 16, 2020

(51) Int. Cl.
| | |
|---|---|
| *H01L 29/78* | (2006.01) |
| *H01L 21/8234* | (2006.01) |
| *H01L 21/02* | (2006.01) |
| *H01L 21/302* | (2006.01) |
| *H01L 23/532* | (2006.01) |
| *H01L 21/762* | (2006.01) |
| *H01L 29/66* | (2006.01) |
| *H01L 29/08* | (2006.01) |
| *H01L 29/06* | (2006.01) |

(52) U.S. Cl.
CPC ........ *H01L 29/785* (2013.01); *H01L 21/0228* (2013.01); *H01L 21/02123* (2013.01); *H01L 21/302* (2013.01); *H01L 21/762* (2013.01); *H01L 21/823431* (2013.01); *H01L 21/823481* (2013.01); *H01L 23/5329* (2013.01); *H01L 29/0649* (2013.01); *H01L 29/0847* (2013.01); *H01L 29/6681* (2013.01)

(58) Field of Classification Search
None
See application file for complete search history.

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,147,765 B2 * | 9/2015 | Xie | ..................... H01L 29/0657 |
| 9,236,267 B2 | 1/2016 | De et al. | |
| 9,245,805 B2 | 1/2016 | Yeh et al. | |
| 9,276,116 B2 * | 3/2016 | Maeda | .................. H01L 29/665 |
| 9,324,623 B1 * | 4/2016 | Kim | ................ H01L 21/823814 |
| 9,406,804 B2 * | 8/2016 | Huang | .............. H01L 29/41791 |
| 9,418,897 B1 | 8/2016 | Ching et al. | |

(Continued)

*Primary Examiner* — David E Graybill
(74) *Attorney, Agent, or Firm* — McClure, Qualey & Rodack, LLP

(57) ABSTRACT

A semiconductor device includes a substrate, a first fin, a second fin, a dummy fin, a first metal gate, a second metal gate, and an isolation structure. The first, the second and the dummy fins are on the substrate, and the dummy fin is disposed between the first fin and the second fin. The first metal gate and the second metal gate are over the first fin and the second fin, respectively. The isolation structure is on the dummy fin, and the dummy fin and the isolation structure separate the first metal gate and the second metal gate.

20 Claims, 23 Drawing Sheets

(56) References Cited

U.S. PATENT DOCUMENTS

| | | | |
|---|---|---|---|
| 9,496,402 B2* | 11/2016 | Fang | H01L 29/0653 |
| 9,520,482 B1 | 12/2016 | Chang et al. | |
| 9,576,814 B2 | 2/2017 | Wu et al. | |
| 9,595,611 B2* | 3/2017 | Kim | H01L 29/785 |
| 9,608,116 B2 | 3/2017 | Ching et al. | |
| 9,659,930 B1* | 5/2017 | Yu | H01L 21/823481 |
| 9,812,363 B1 | 11/2017 | Liao et al. | |
| 9,842,909 B2* | 12/2017 | Maeda | H01L 29/165 |
| 9,853,111 B2* | 12/2017 | Choi | H01L 21/31116 |
| 9,859,380 B2 | 1/2018 | Lee et al. | |
| 9,929,242 B2* | 3/2018 | Chang | H01L 29/66795 |
| 9,941,374 B2* | 4/2018 | Diaz | H01L 29/785 |
| 9,953,979 B2* | 4/2018 | Xu | H01L 29/785 |
| 9,997,633 B2* | 6/2018 | Hsiao | H01L 29/785 |
| 10,026,737 B1* | 7/2018 | Ching | H01L 21/823481 |
| 10,032,759 B2* | 7/2018 | Chen | H01L 27/0886 |
| 10,084,049 B2* | 9/2018 | Kim | H01L 21/28518 |
| 10,535,735 B2* | 1/2020 | Glass | H01L 29/7833 |
| 10,714,581 B2* | 7/2020 | Chang | H01L 21/31111 |
| 10,714,599 B2* | 7/2020 | Lee, II | H01L 29/0653 |
| 2011/0068407 A1* | 3/2011 | Yeh | H01L 21/823807 257/369 |
| 2013/0011983 A1* | 1/2013 | Tsai | H01L 29/7848 438/285 |
| 2013/0187228 A1* | 7/2013 | Xie | H01L 29/518 257/347 |
| 2013/0210232 A1* | 8/2013 | De | H01L 21/845 438/700 |
| 2014/0001520 A1* | 1/2014 | Glass | H01L 29/66795 257/288 |
| 2014/0203370 A1* | 7/2014 | Maeda | H01L 29/41791 257/365 |
| 2014/0252412 A1* | 9/2014 | Tsai | H01L 21/02576 257/192 |
| 2015/0035023 A1* | 2/2015 | Kim | H01L 27/0886 257/288 |
| 2015/0137181 A1* | 5/2015 | Basker | H01L 29/41791 257/192 |
| 2015/0295089 A1* | 10/2015 | Huang | H01L 29/66795 257/401 |
| 2016/0005617 A1* | 1/2016 | Wu | H01L 21/31144 438/702 |
| 2016/0155816 A1* | 6/2016 | Maeda | H01L 29/66545 438/283 |
| 2016/0204215 A1* | 7/2016 | Chang | H01L 29/7851 257/401 |
| 2016/0240652 A1* | 8/2016 | Ching | H01L 29/42392 |
| 2016/0359008 A1* | 12/2016 | Choi | H01L 21/823821 |
| 2017/0125411 A1* | 5/2017 | Yu | H01L 29/66545 |
| 2017/0179291 A1* | 6/2017 | Lee | H01L 29/165 |
| 2017/0338323 A1* | 11/2017 | Cheng | H01L 21/02236 |
| 2018/0151551 A1* | 5/2018 | Chen | H01L 23/528 |
| 2018/0182857 A1* | 6/2018 | Chang | H01L 27/0886 |
| 2018/0190652 A1* | 7/2018 | Ching | H01L 27/0886 |
| 2019/0312124 A1* | 10/2019 | Lee, II | H01L 21/823431 |
| 2020/0020794 A1* | 1/2020 | Lin | H01L 29/0649 |

* cited by examiner

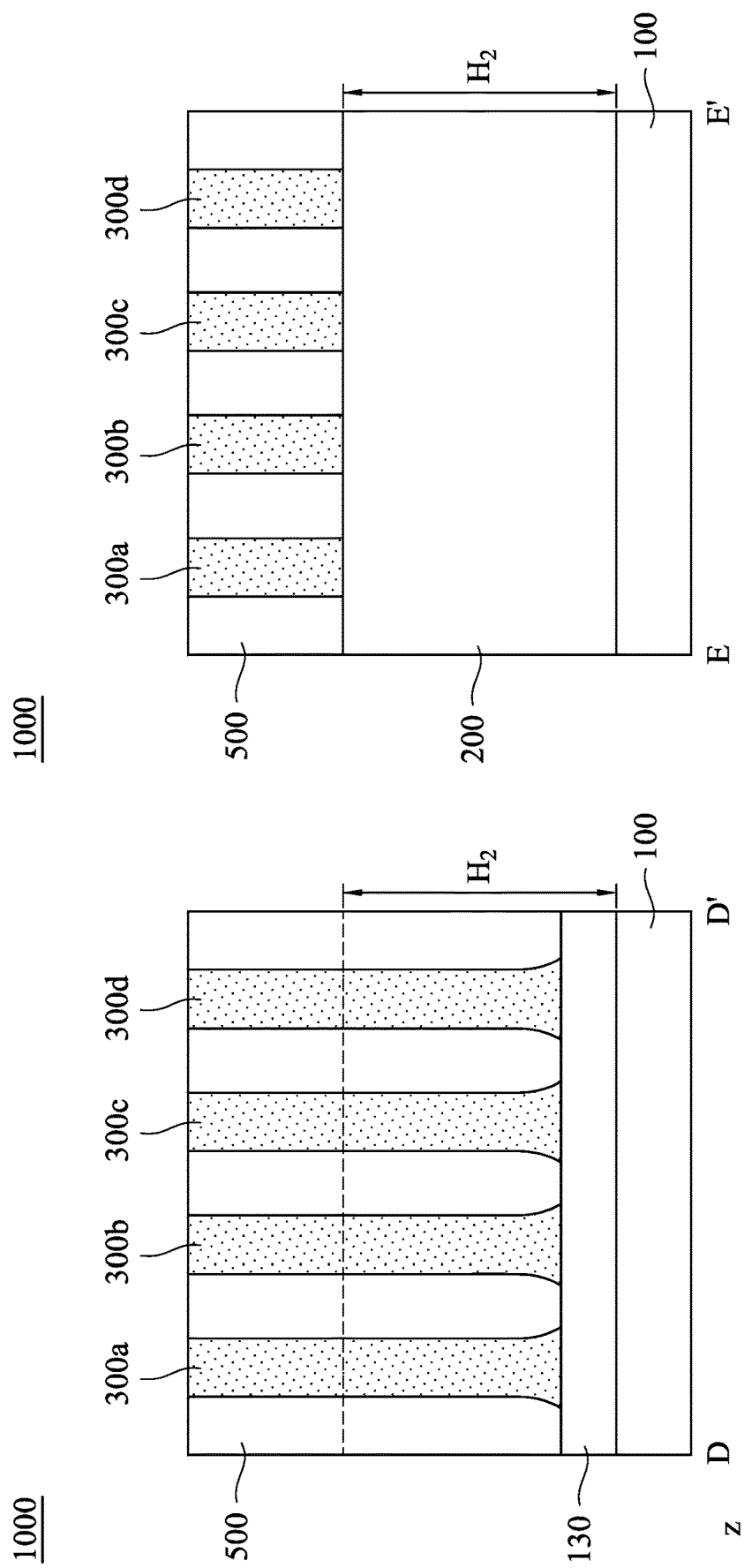

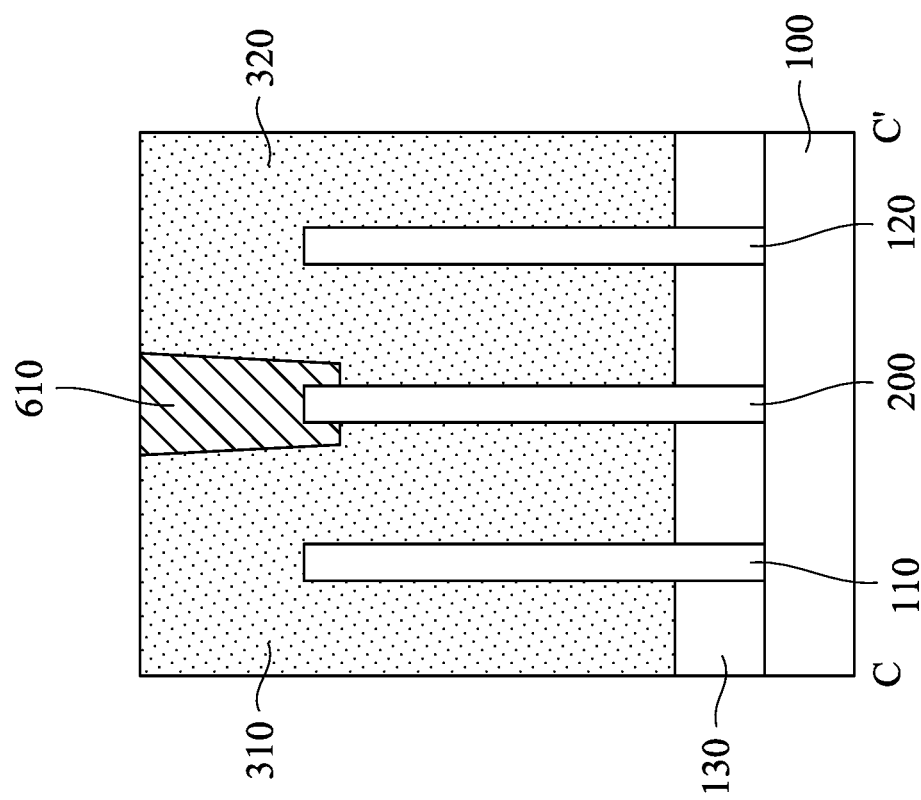
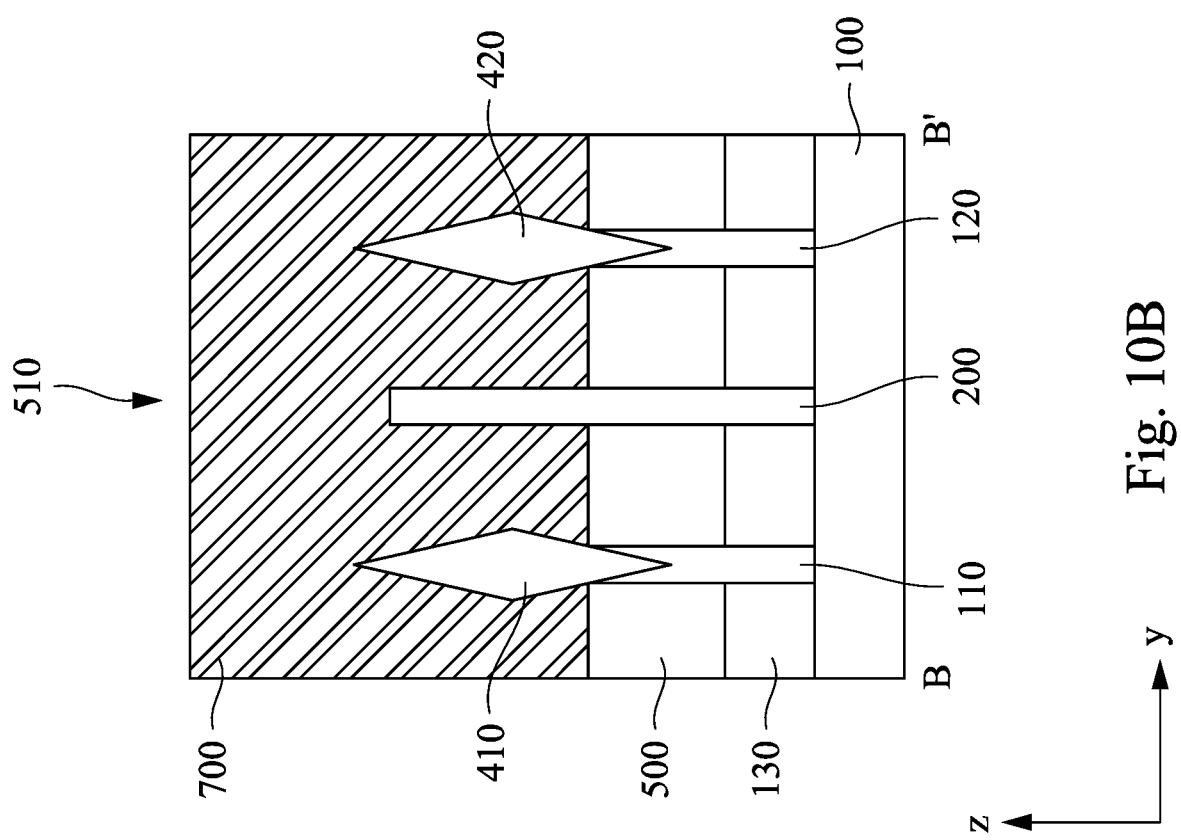
Fig. 10C
Fig. 10B

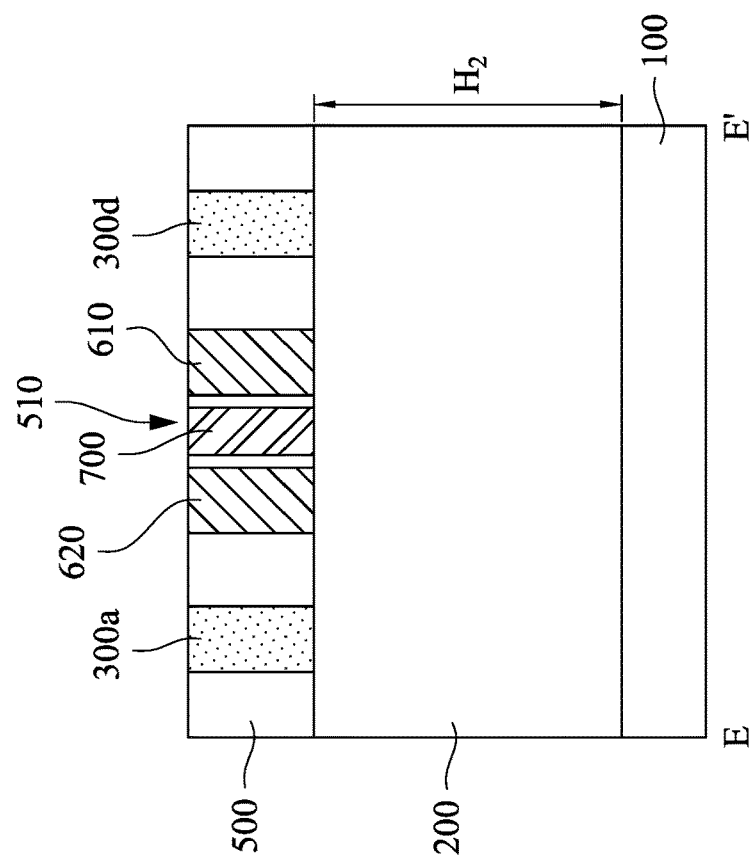
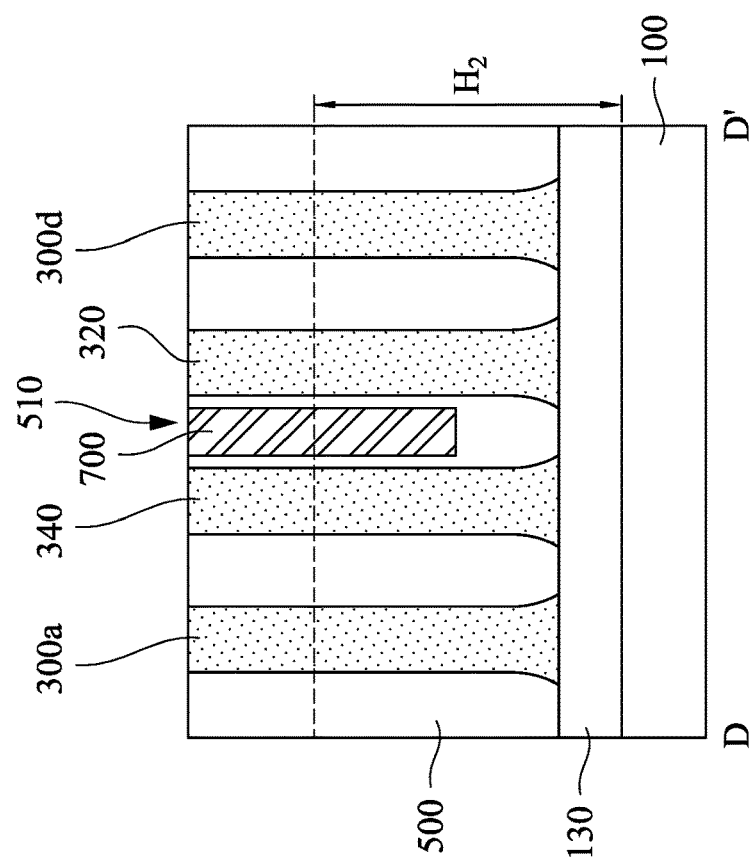
Fig. 10E
Fig. 10D

SEMICONDUCTOR DEVICE AND METHOD OF MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. As the semiconductor industry has strived for higher device density, higher performance, and lower costs, problems involving both fabrication and design have been encountered, therefore leading semiconductor technologies to three-dimensional designs, such as fin-like field effect transistors (FinFETs).

A FinFET includes a thin vertical 'fin' extending on a substrate. The source, drain, and channel regions are defined within this fin. The transistor's gate wraps around the channel region of the fin. This configuration allows the FinFET devices to have the benefits of reduced leakage current and short-channel effects, as compared to traditional transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2B to 2E are cross-sectional views of the semiconductor device in FIG. 2A in accordance with some embodiments of the present disclosure.

FIGS. 10B to 10E are cross-sectional views of the semiconductor device in FIG. 10A in accordance with some embodiments of the present disclosure.

DETAILED DESCRIPTION

Figure 1:
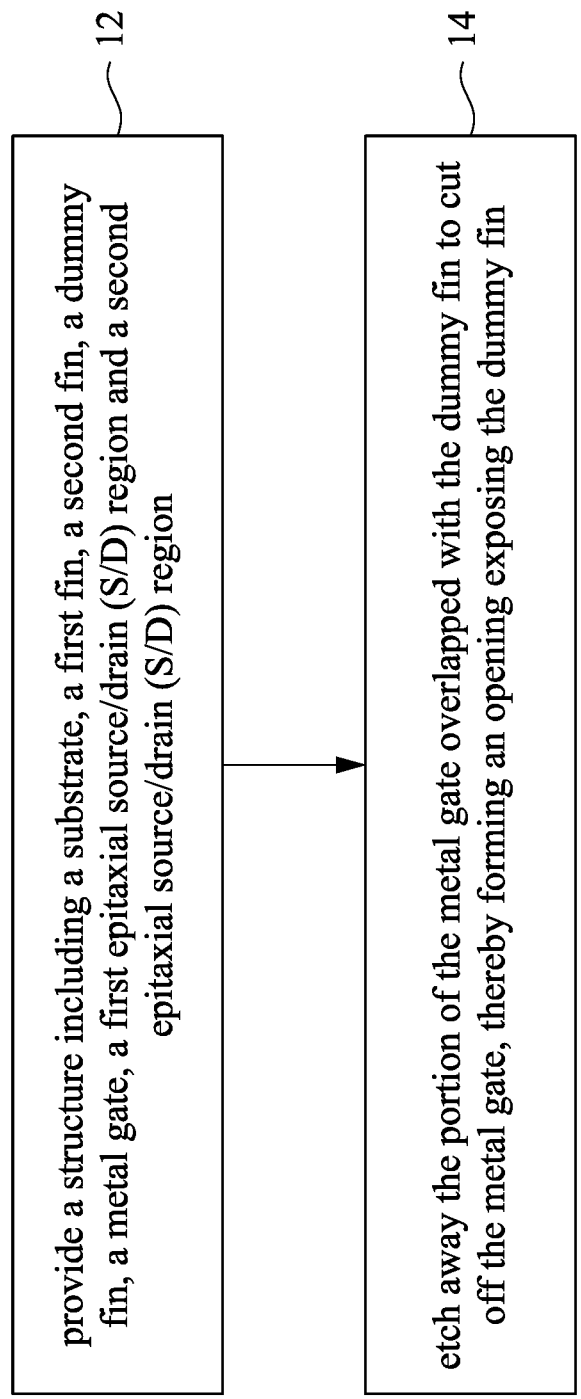
FIG. 1 is a flow chart illustrating a method of forming a semiconductor structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method of manufacturing a semiconductor structure according to various embodiments of the present disclosure. As illustrated in FIG. 1, the method 10 includes at least operations 12 and 14. FIGS. 2A-3E are drawings schematically illustrating various stages of the method 10 in FIG. 1 according to various embodiments. In FIGS. 2A-3E, figures ending with an "A" designation are illustrated a plan view, figures ending with an "B" designation are illustrated along a similar cross-section B-B', figures ending with a "C" designation are illustrated along a similar cross-section C-C', figures ending with a "D" designation are illustrated along a similar cross-section D-D', and figures ending with a "E" designation are illustrated along a similar cross-section E-E'.

Referring to FIG. 1, the method 10 begins at the operation 12 by providing a structure 1000. FIGS. 2A-2E are drawings illustrating the structure 1000. The structure 1000 includes a substrate 100, a first fin 110, a second fin 120, a dummy fin 200, one or more metal gates 300 (such as metal gates 300a, 300b, 300c, 300d), a first epitaxial source/drain (S/D) region 410, and a second epitaxial source/drain (S/D) region 420.

The substrate 100, for example, may be a bulk semiconductor, a semiconductor-on-insulator (SOI) substrate, or the like, which may be doped (e.g., with a p-type or an n-type dopant) or undoped. In some embodiments, the substrate 100 may include silicon (Si), germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in FIGS. 2A-2E, the first fin 110 and the second fin 120 are formed on the substrate 100 (shown in FIGS.

2B-2E). In some embodiments, the first fin 110 and the second fin 120 extend along an x direction in parallel, and are spaced apart from each other.

Figure 2A:
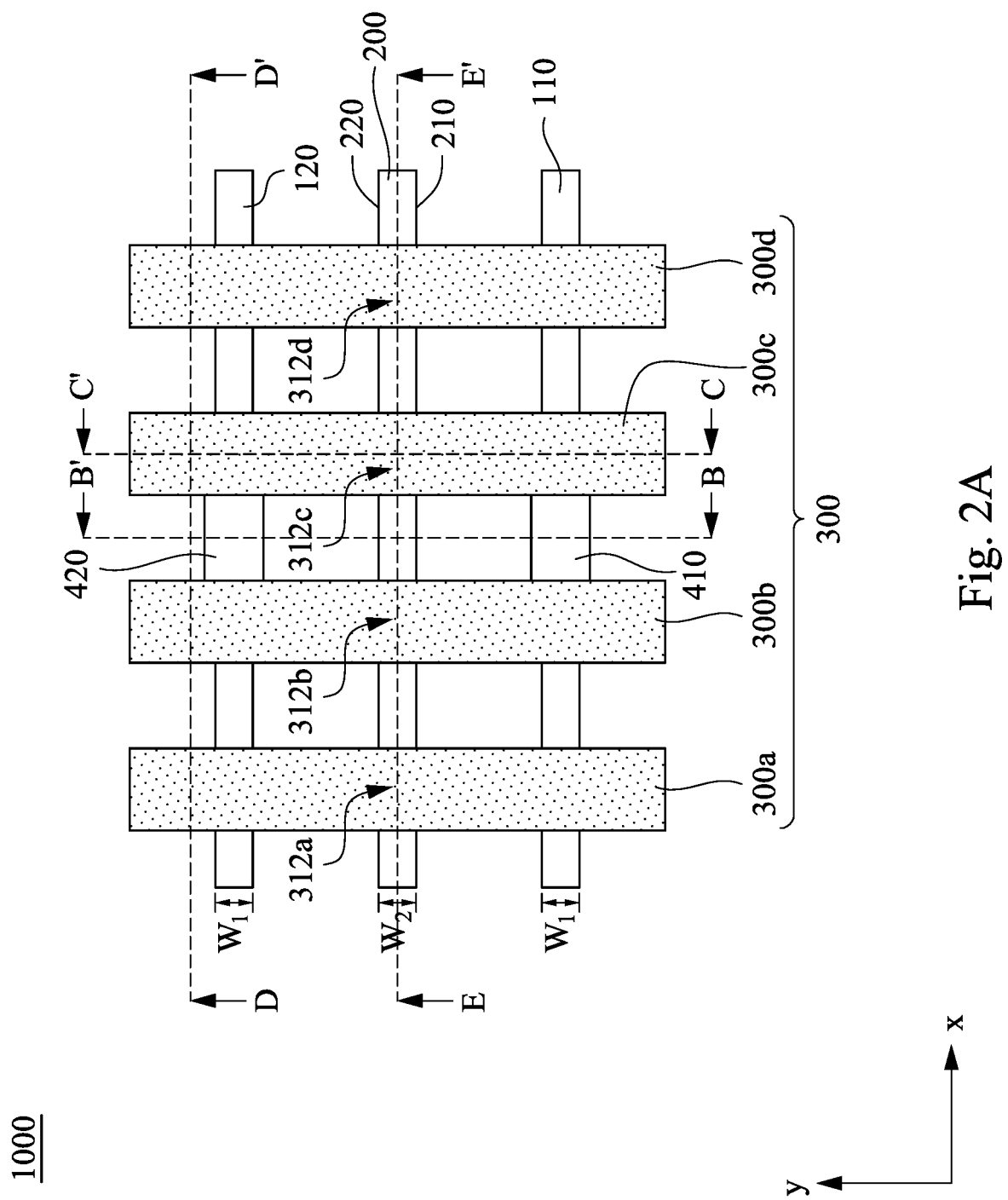
FIGS. 2A, 3A, 5A, 6A 8A, 9A, 10A are a top view of various intermediary stages in the manufacturing of semiconductor device in accordance with some embodiments of the present disclosure.
Figure 2C:
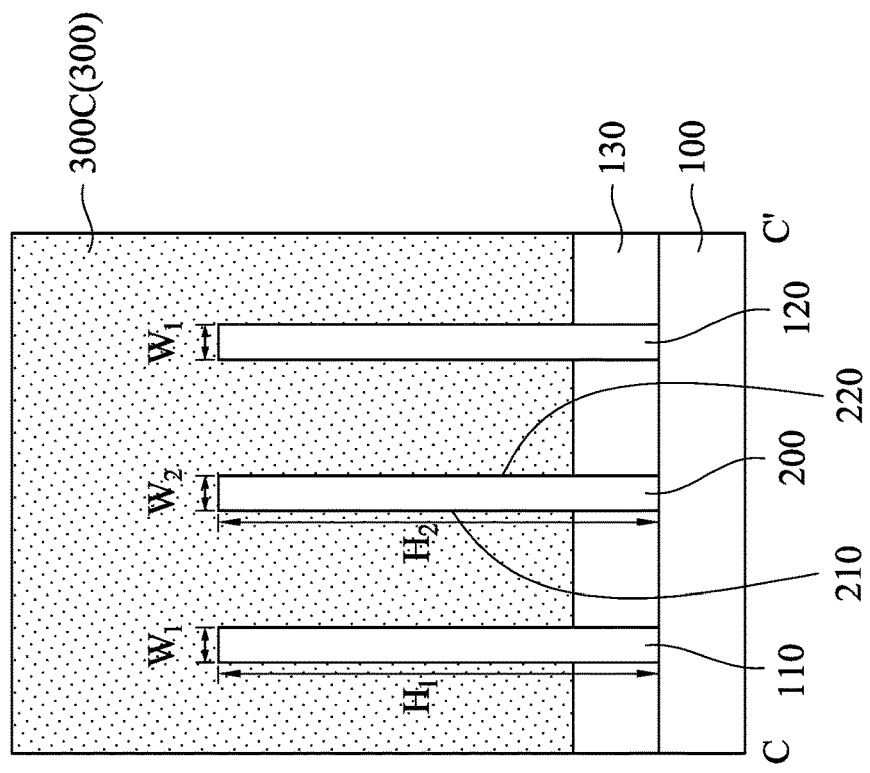
Figure 2B:
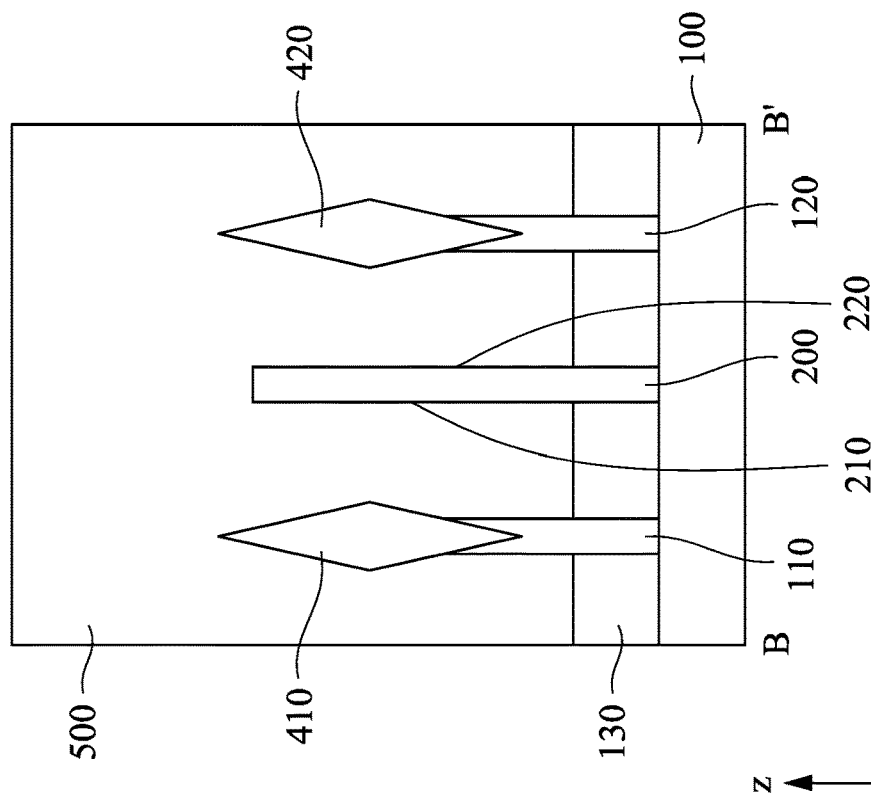

In some embodiments, the first fin 110 and the second fin 120 may include one or more semiconductor materials such as silicon, germanium, silicon carbide, gallium arsenide, gallium phosphide, indium phosphide, indium arsenide, indium antimonide, silicon germanium, gallium arsenide phosphide, aluminum indium phosphide, aluminum gallium arsenide, gallium indium arsenide, gallium indium phosphide, and gallium indium arsenide phosphide. In yet some embodiments, the first fin 110 and the second fin 120 may be formed by epitaxially growing one or more semiconductor layers over the substrate 100 and then be patterned by any suitable method. The first fin 110 and the second fin 120 have a fin height H1 and a width W1, as shown in FIGS. 2A-2C. In some embodiments, the height H1 ranges from about 30-80 nm.

The dummy fin 200 is formed on the substrate 100 and located between the first fin 110 and the second fin 120. The dummy fin 200 also extends along the x direction, and is spaced apart from the first fin 110 and the second fin 120. In various embodiments, the dummy fin 200 may include SiO, SiN, SiON, SiOCN, hafnium silicon oxide, zirconium silicon oxide, aluminum silicon oxide, or a combination of thereof. As shown in FIGS. 2A-2C, the dummy fin 200 has opposite sidewalls 210 and 220. The sidewall 210 faces the first fin 110, and the sidewall 220 faces to the second fin 120. The dummy fin 200 has a height H2 and a width W2. In some embodiments, the width W2 of the dummy fin 200 may be equal to the width W1 of the first and second fins 110 and 120. In some yet embodiments, the width W2 of the dummy fin 200 may be greater or less than the width W1 of the first and second fins 110 and 120. In examples, the width W2 of the dummy fin 200 may be 3-100 nm, such as 5, 7, 10, 13, 18, 20, 25, 30, 32, 36, 40, 44, 48, 50, 55, 60, 63, 65, 70, 74, 78, 80, 85, 90 or 95 nm. In some embodiments, the height H2 of the dummy fin 200 may be equal to the height H1 of the first and the second fins 110 and 120. In yet some embodiments, the height H2 of the dummy fin 200 may be greater or smaller than the height H1 of the first and the second fin 110 and 120.

The fins (such as fins 110, 120, 200) may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. In examples, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The metal gates 300 traverse the first fin 110, the dummy fin 200 and the second fin 120. As shown in FIG. 2A, the metal gates 300 may include metal gates 300a, 300b, 300c and 300d, for example. The metal gates 300a, 300b, 300c and 300d extend along a y direction which is different from the x direction. For example, the y direction may be substantially perpendicular to the x direction. The metal gates 300a, 300b, 300c and 300d cross over the first and second fins 110,120 and the dummy fin 200. Each of the metal gates 300a, 300b, 300c and 300 has a portion (such as 312a, 312b, 312c, 312d shown in FIG. 2A) overlapped with the dummy fin 200. In various embodiments, each of the metal gates 300a, 300b, 300c, 300d may include multiple layers. For example, each metal gate 300 may include a dielectric layer and a conductive layer (not shown). In some embodiments, the dielectric layer may include one or more dielectric material. In some examples, the dielectric layer may include high-k dielectric material, silicon nitride, silicon oxide, silicon oxynitride, or the combination thereof, or the like. In some embodiments, the conductive layer may include one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. In some embodiments, the formation of the metal gates 300 may include using replacement gate process where it first forms dummy gate structures and then replaces the dummy gate structures with the metal gates 300.

The first and the second epitaxial source/drain (S/D) region 410 and 420 are on the first fin 110 and the second fin 120, respectively. It is noted that not all of the first and the second epitaxial source/drain (S/D) regions 410 and 420 are illustrated in FIG. 2A for the sake of simplicity. As shown in FIG. 2A, the first and the second epitaxial source/drain (S/D) region 410 and 420 are disposed between and directly contact with the metal gates 300b and 300c. As shown in FIG. 2B, the first and the second epitaxial source/drain (S/D) regions 410 and 420 are separated by the dummy fin 200. In various embodiments, the first and the second epitaxial source/drain region 410 and 420 may include silicon (Si), germanium (Ge) or silicon germanium (SiGe). In some embodiments, the first and the second epitaxial source/drain region 410 and 420 may be doped with an n-type dopant such as phosphorus (P), arsenic (As) and antimony (Sb), and/or be doped with an p-type dopant such as boron (B), aluminum (Al), indium (In), and gallium (Ga), respectively. The first and the second epitaxial source/drain (S/D) region 410 and 420 may be epitaxially grown by a molecular beam epitaxy (MBE) process, a chemical vapor deposition (CVD) process such as a metal organic CVD (MOCVD) process, and/or other suitable epitaxial growth processes.

An interlayer dielectric (ILD) layer 500 is further included in the structure 1000, as shown in FIGS. 2B, 2D and 2E. The ILD layer 500 is not shown in FIG. 2A for the sake of simplicity. The interlayer dielectric (ILD) layer 500 covers the first and the second epitaxial source/drain (S/D) region 410 and 420. Additionally, the ILD layer 500 does not completely cover the metal gates 300a, 300b, 300c and 300d, and is formed among the metal gates 300a, 300b, 300c and 300d (shown in FIGS. 2D and 2E). In various embodiments, the ILD layer 500 may include silicon oxide, silicon nitride, silicon oxynitride, tetraethoxysilane (TEOS), phosphosilicate glass (PSG), borophosphosilicate glass (BPSG), low-k dielectric material such as fluorinated silica glass (FSG), and/or other suitable dielectric materials. The ILD layer 500 may be formed by using the CVD, FCVD, ALD, or other suitable methods.

Referring to FIGS. 2B-2D, the structure 1000 may further include shallow trench isolation (STI) regions 130 on the substrate 100 between the first fin 110, the second fin 120 and the dummy fin 200 in accordance with some embodiments. In various embodiments, the STI regions 130 may include silicon oxide, silicon nitride, silicon oxynitride, polymer dielectric, combinations thereof, or the like. The formation of the STI regions 130 may include thermal oxidation, chemical oxidation, and chemical vapor deposition (CVD), flowable CVD (FCVD), or the like.

Figure 3A:
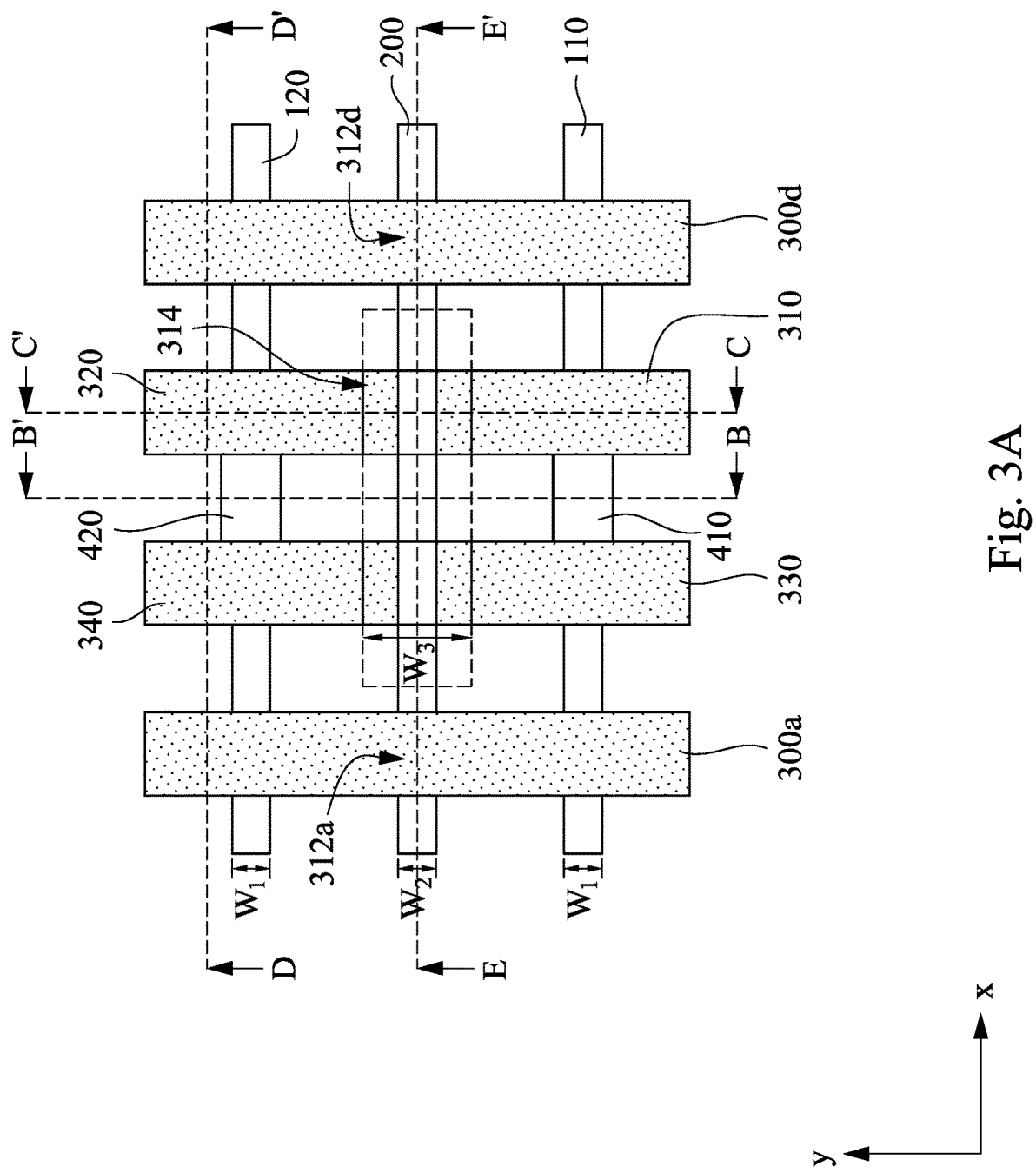
Figure 3B:
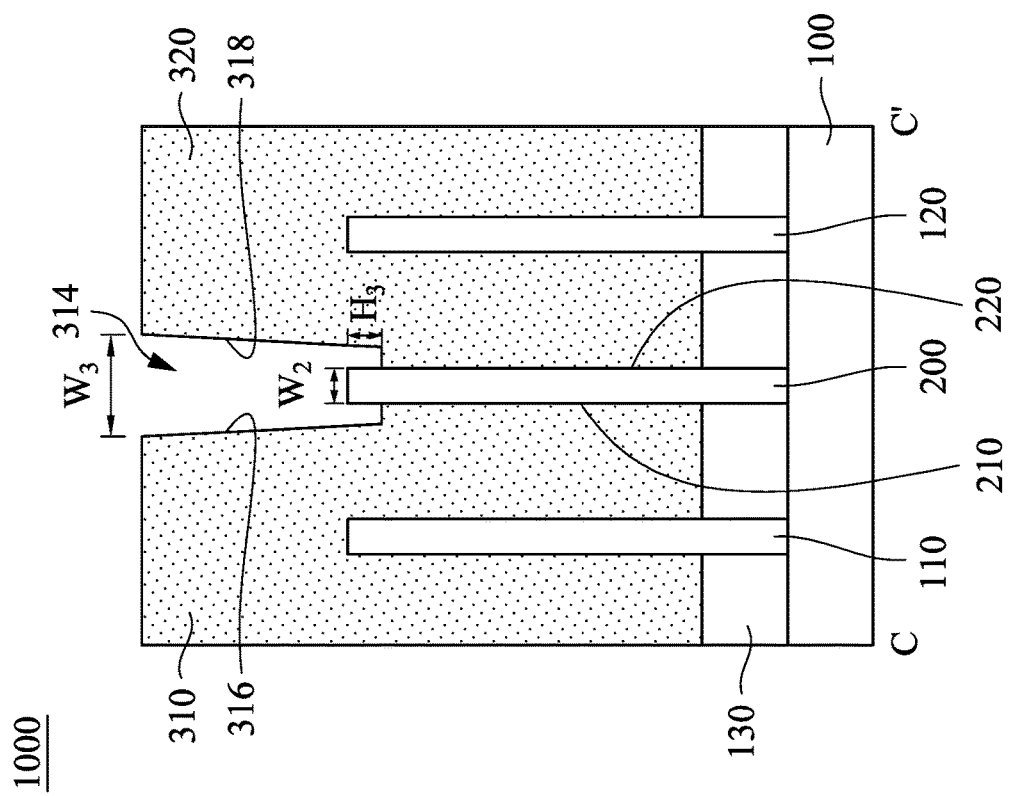
FIGS. 3B to 3E are cross-sectional views of the semiconductor device in FIG. 3A in accordance with some embodiments of the present disclosure.
Figure 3C:
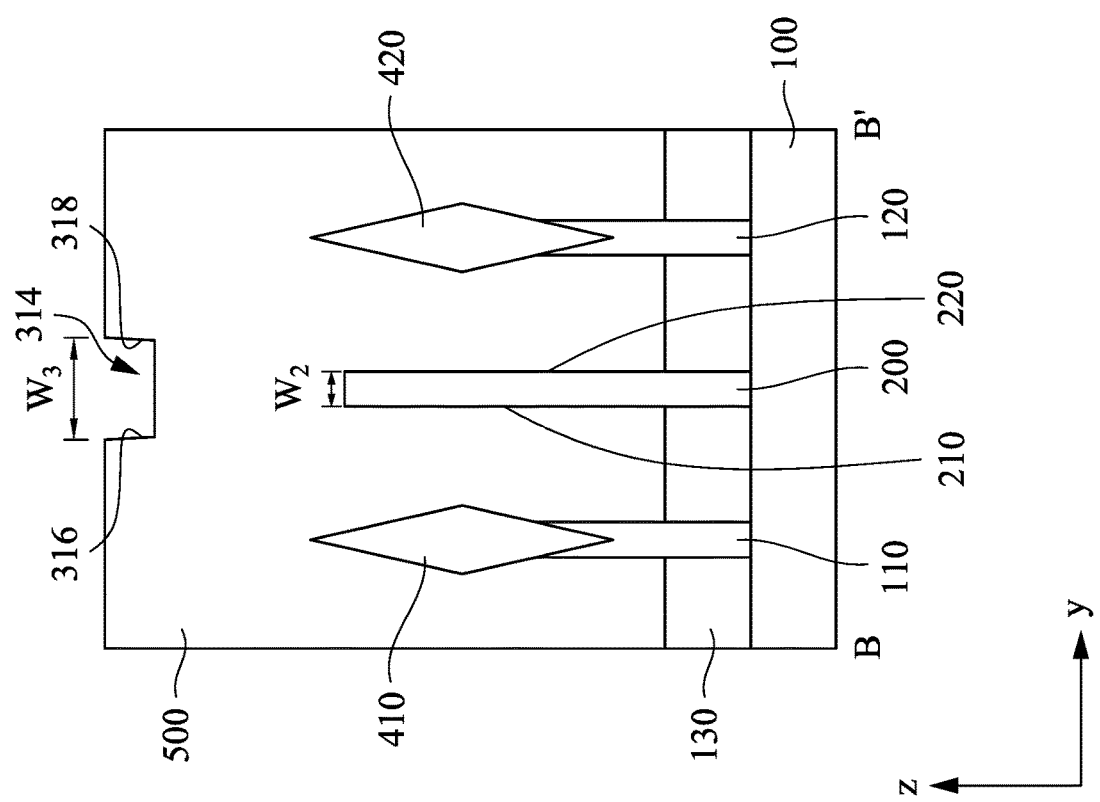
Figure 3E:
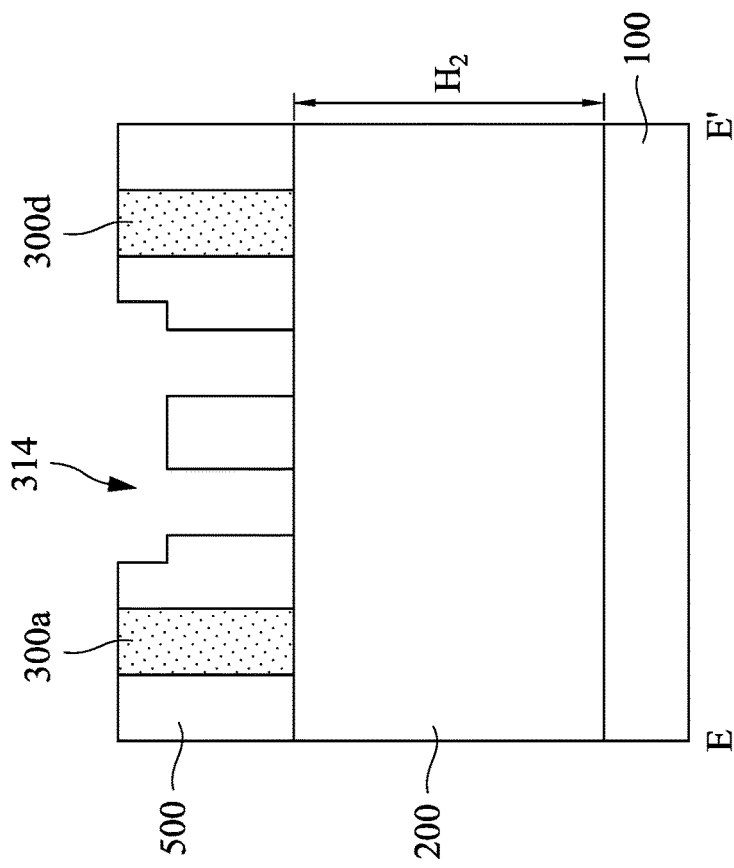
Figure 3D:
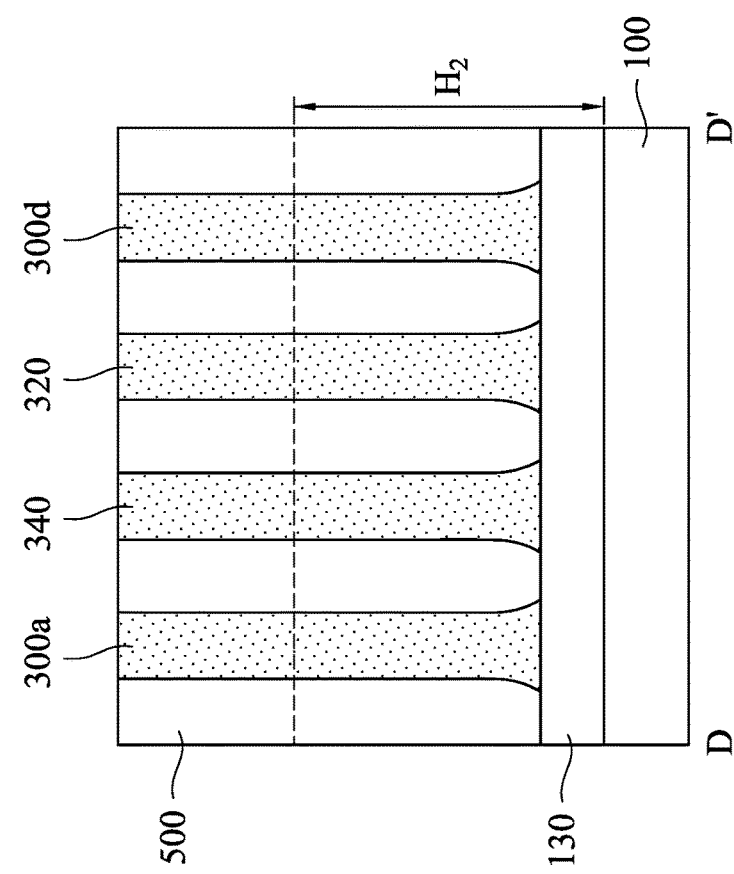

Referring back to FIG. 1, the method 10 proceeds to the operation 14 by etching away at least one of the overlapped portions 312a, 312b, 312c, 312d of the metal gates 300, as depicted in FIGS. 3A-3E. The etching process of the operation 14 cuts off at least one of the metal gates 300, and forms an opening 314 (i.e., the dash-lined box shown in FIG. 3A) exposing the dummy fin 200. As illustrated in FIGS. 3A-3E, the portions 312b, 312c (with reference to FIG. 2A) of the metal gates 300b, 300c overlapped with the dummy fin 200 are etched, thereby forming the opening 314 exposing the dummy fin 200. Specifically, the metal gate 300c is cut to form a first metal gate 310 and a second metal gate 320. Also, the metal gate 300b is cut to form a third metal gate 330 and a fourth metal gate 340. The opening 314 has a side surface 316 (shown in FIGS. 3B and 3C) which is adjacent to the first metal gate 310, and a side surface 318 (shown in FIGS. 3B and 3C) which is adjacent to the second metal gate 320. As shown in FIGS. 3A and 3C, the opening 314 has a bottom below a top of the dummy fin 200, but the opening 314 does not pass through the metal gate 300b and 300c from top to bottom. In some embodiments, the opening 314 may expose top portions of the sidewalls 210 and 220 of the dummy fin 200. In examples, the exposed portion of the sidewalls 210 and 220 of the dummy fin 200 has a height H3 of approximately 0-20 nm. In yet some embodiments, the opening 314 has a width W3 that is greater than the width W2 of the dummy fin 200. For example, the width W2 of the dummy fin 200 may be 3-10 nm, and the opening 314 may be 5-80 nm. The shape of the opening 314 may depend on the etching process. In some embodiments, a portion of the ILD layer 500 is also etched (shown in FIGS. 3B and 3E) during the etching process in operation 14 due to the etching selectivity. The etching of the operation 14 may be implemented by dry etching processes, wet etching processes, and/or other suitable etching method.

Figure 4:
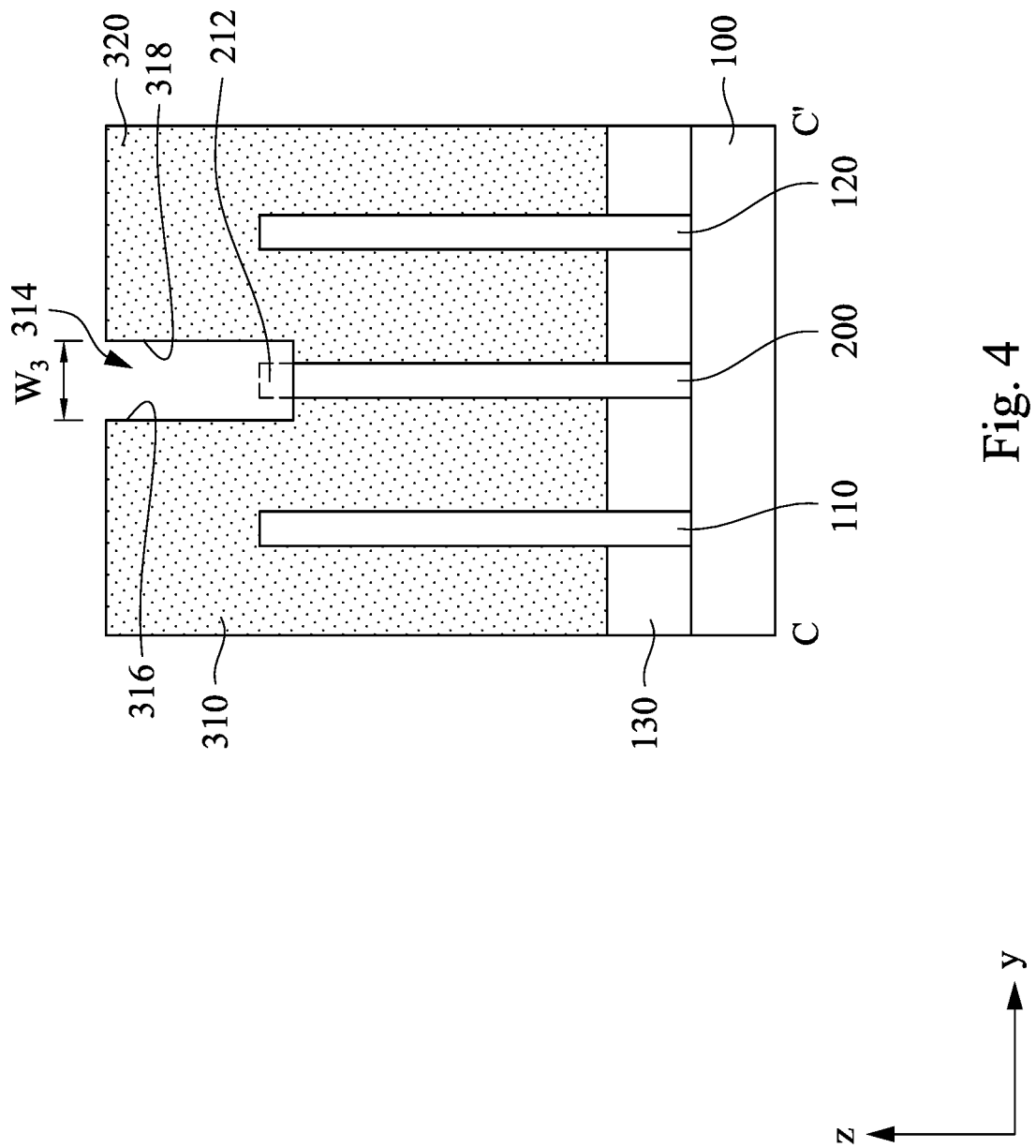
FIG. 4 is a cross-sectional view of the semiconductor device in FIG. 3A in accordance with some embodiments of the present disclosure.

Reference is made to FIG. 4, which is cross-sectional view along the same cross section as FIG. 3C after performing the etching of the operation 14, according to yet some embodiments. As illustrated, a top portion 212 of the dummy fin 200 may be optionally removed in the operation 14. That is, a bottom surface of the opening 314 may be a substantially plane surface. In some examples, the side surfaces 316 and 318 of the opening 314 may be substantially vertical surfaces.

Figure 5A:
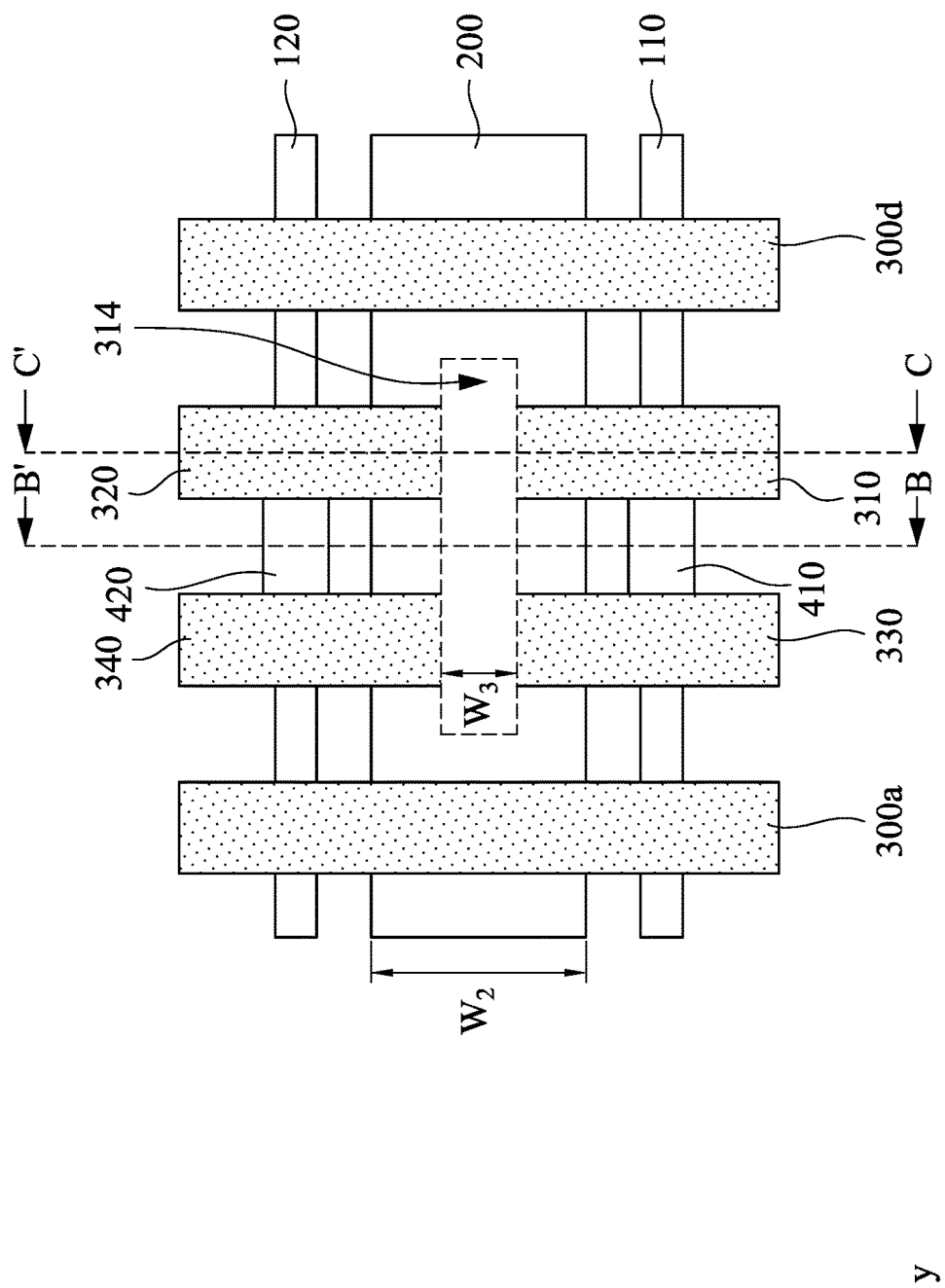
Figure 5C:
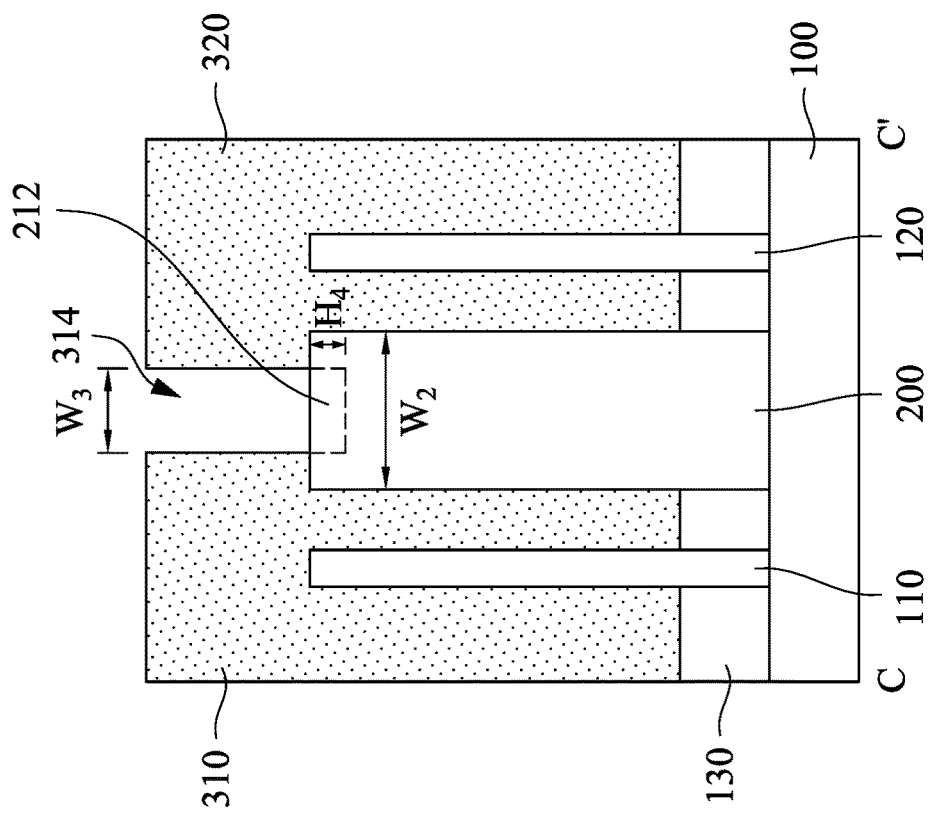
FIGS. 5B to 5C are cross-sectional views of the semiconductor device in FIG. 5A in accordance with some embodiments of the present disclosure.
Figure 5B:
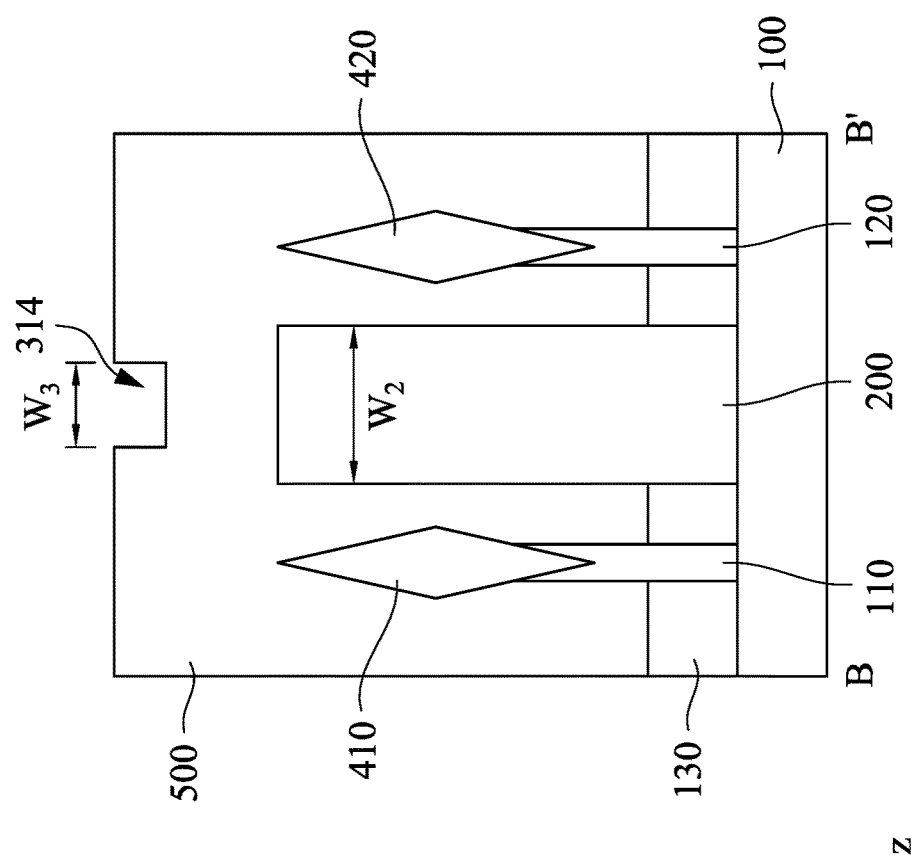

FIGS. 5A-5C are drawings illustrating the structures after the etching of the operation 14 is performed, according to yet some embodiments. As shown in FIGS. 5A-5C, the opening 314 has a width W3 that is smaller than the width W2 of the dummy fin 200. For example, the width W2 of the dummy fin 200 may be 10-100 nm, and the width W3 of the opening 314 may be 5-80 nm. In some examples, the opening 314 may be positioned at the middle of the dummy fin 200 in a plan view, as shown in FIG. 5A. In yet some examples, a top portion of the dummy fin 200 may be optionally removed in the operation 14, and a recess 212 (dashed line shown in FIG. 5C) is formed. The recess 212 may have a depth H4 of approximately 0-20 nm. Other features of the embodiments shown in FIGS. 5A-5C may be the same as these described hereinbefore in connection with FIGS. 3A-3E and 4.

Figure 6A:
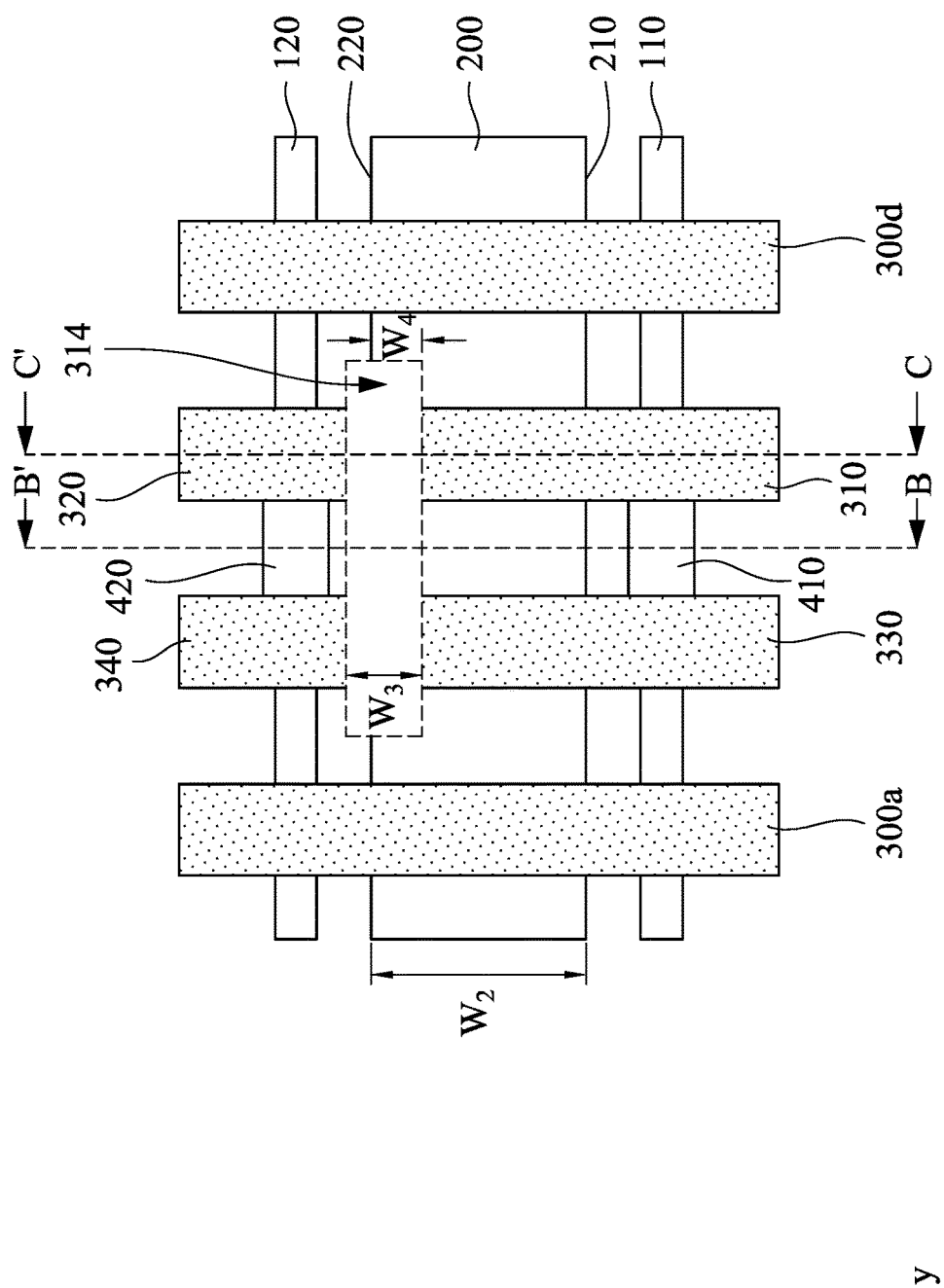
Figure 6C:
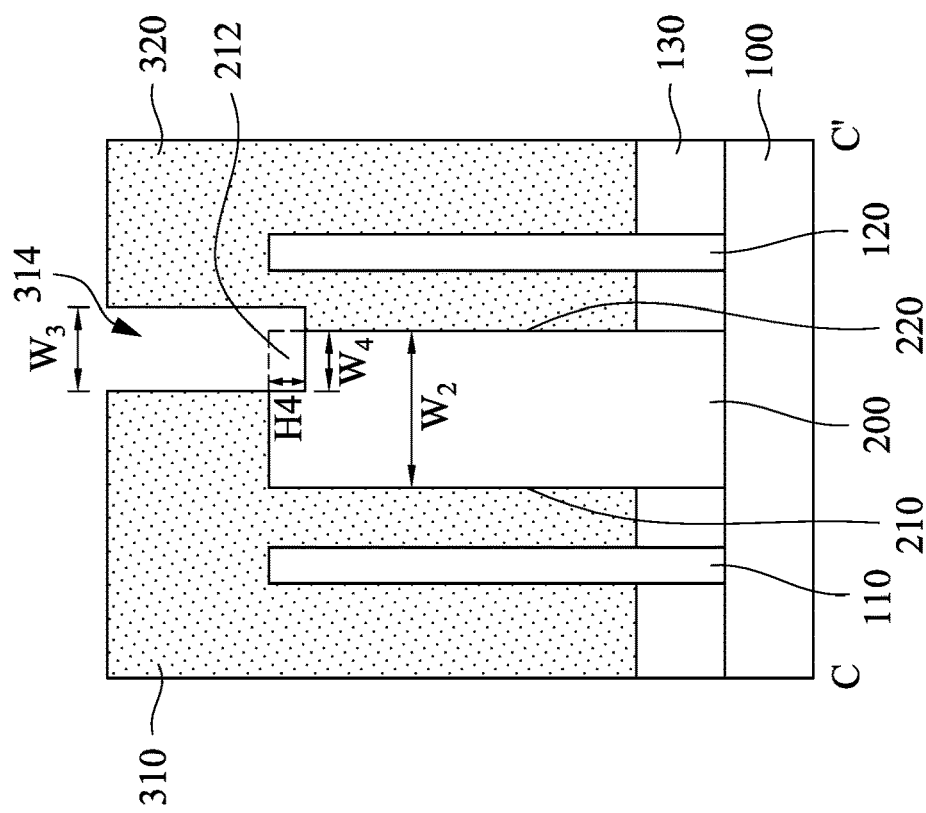
FIGS. 6B to 6C are cross-sectional views of the semiconductor device in FIG. 6A in accordance with some embodiments of the present disclosure.
Figure 6B:
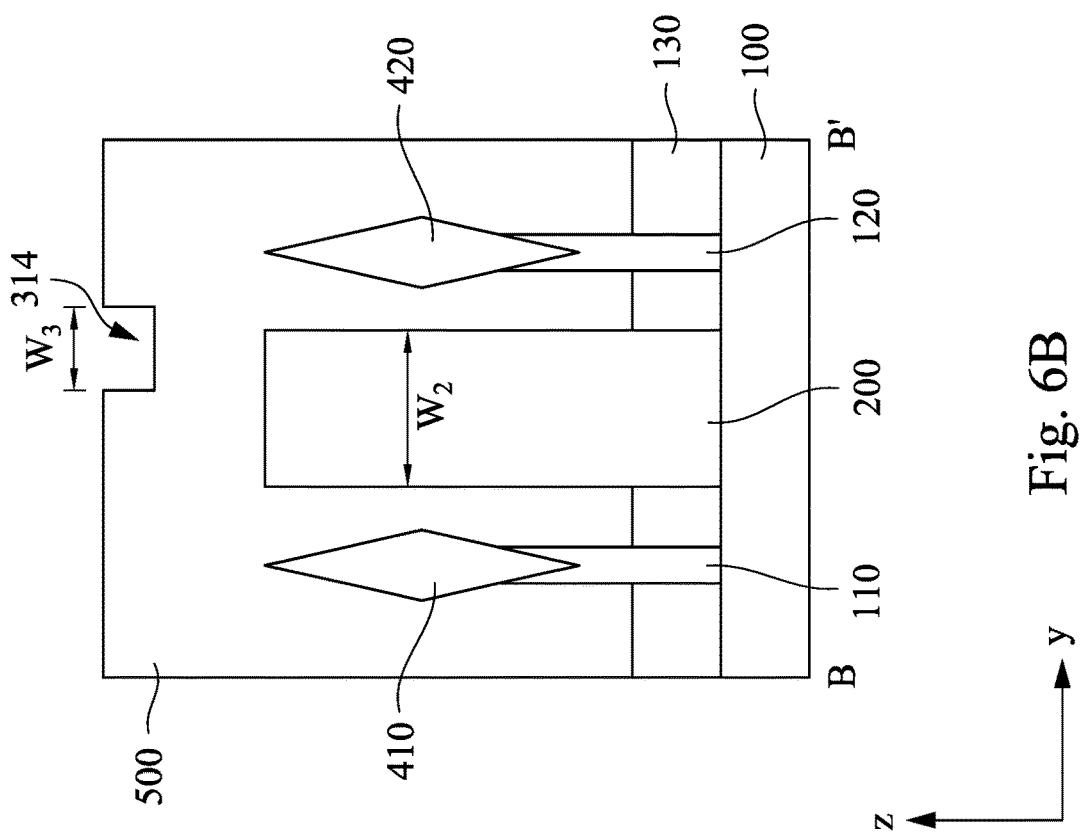

FIGS. 6A-6C are drawings illustrating the structures after the etching of the operation 14 is performed, according to yet some embodiments. The formed opening 314 may be close to the second fin 120, and exposes a portion of the sidewall 220 of the dummy fin 200. In yet other examples, the opening 314 may be close to the first fin 110, and exposes a portion of the sidewall 210 of the dummy fin 200. As illustrated in FIGS. 6A-6C, a top surface of the dummy fin 200 exposed by the opening 314 has a width W4. In some examples, the width W4 is at least greater than 3 nm. In some embodiments, at the operation 14, a top portion of the dummy fin 200 may be optionally removed, as shown in FIG. 6C. In yet some examples, a top portion of the dummy fin 200 may be optionally removed in the operation 14, and a recess 212 (dashed line shown in FIG. 6C) is formed. The recess 212 may have a depth H4 of approximately 0-20 nm. Other features of the embodiments shown in FIGS. 6A-6C may be the same as these described hereinbefore in connection with FIGS. 3A-3E and 4.

It will be appreciated that although the methods disclosed herein each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Figure 7:
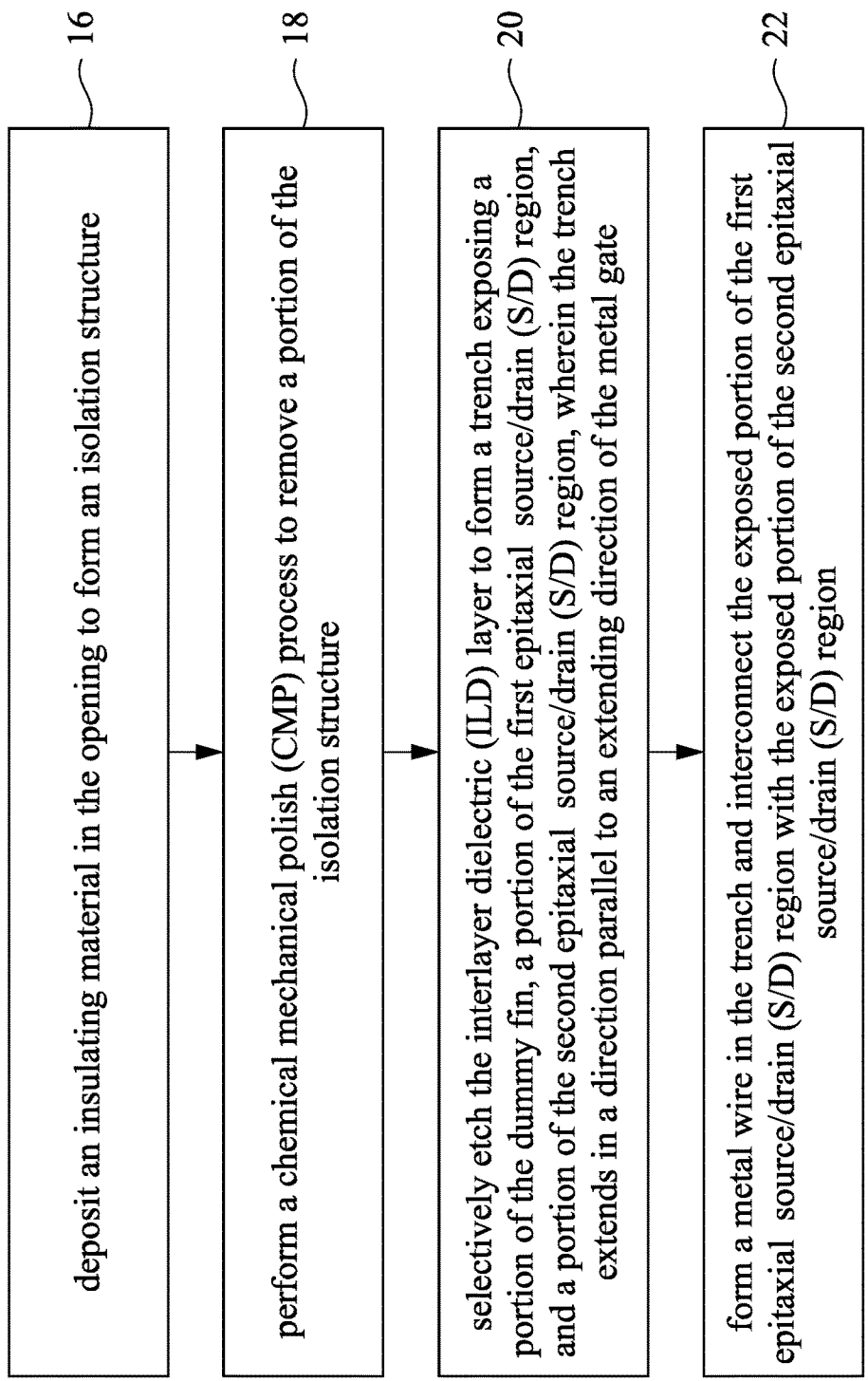
FIG. 7 is a flow chart illustrating a method of forming a semiconductor structure according to various embodiments of the present disclosure.
Figure 8A:
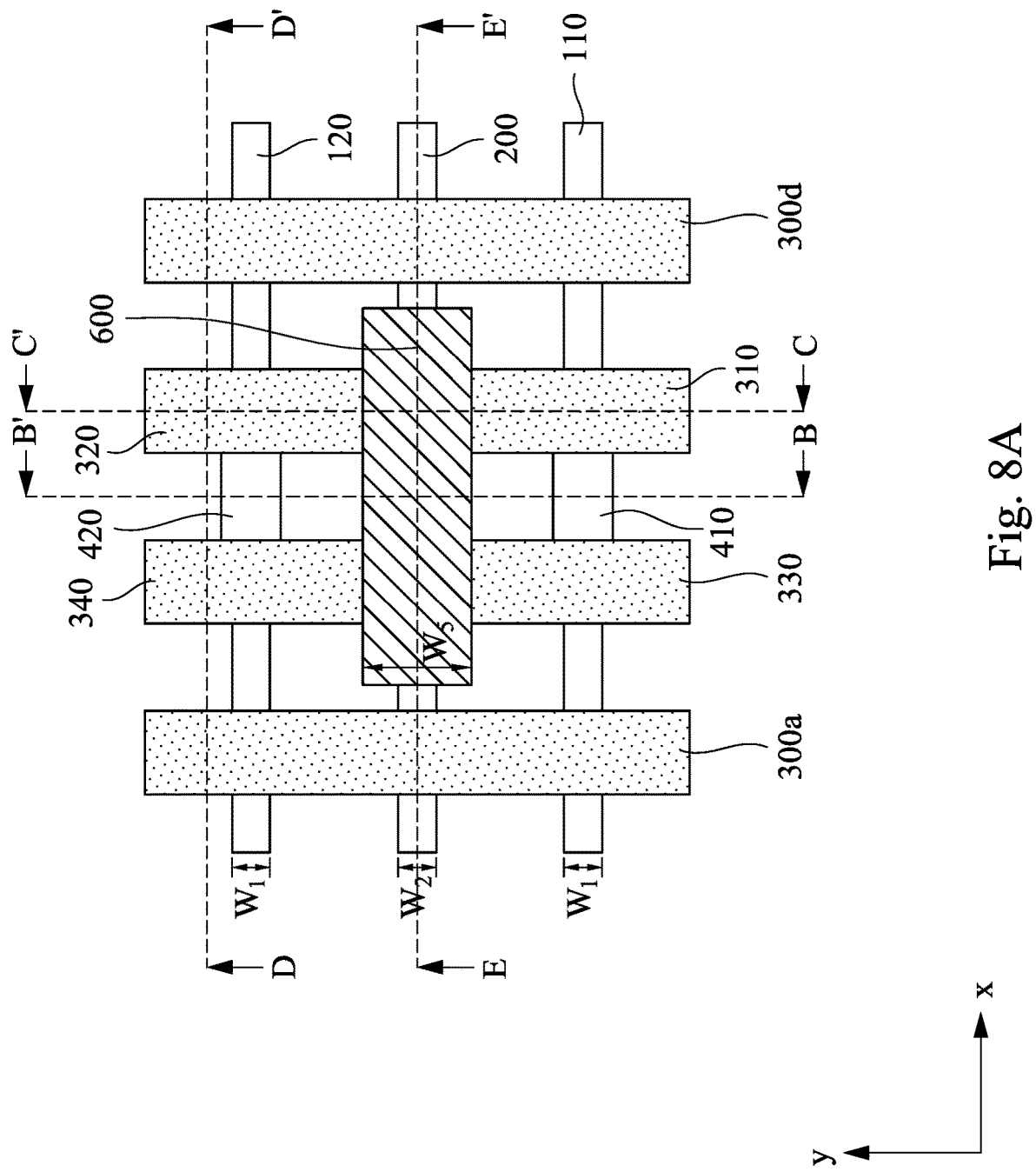
Figure 8C:
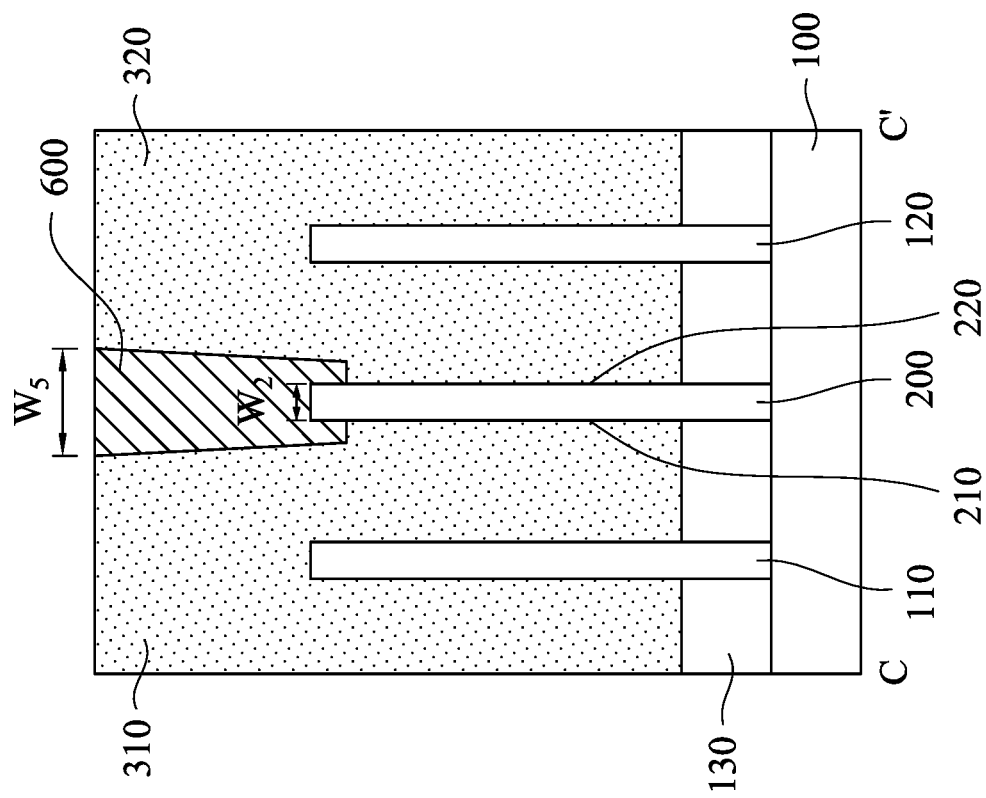
FIGS. 8B to 8E are cross-sectional views of the semiconductor device in FIG. 8A in accordance with some embodiments of the present disclosure.
Figure 8B:
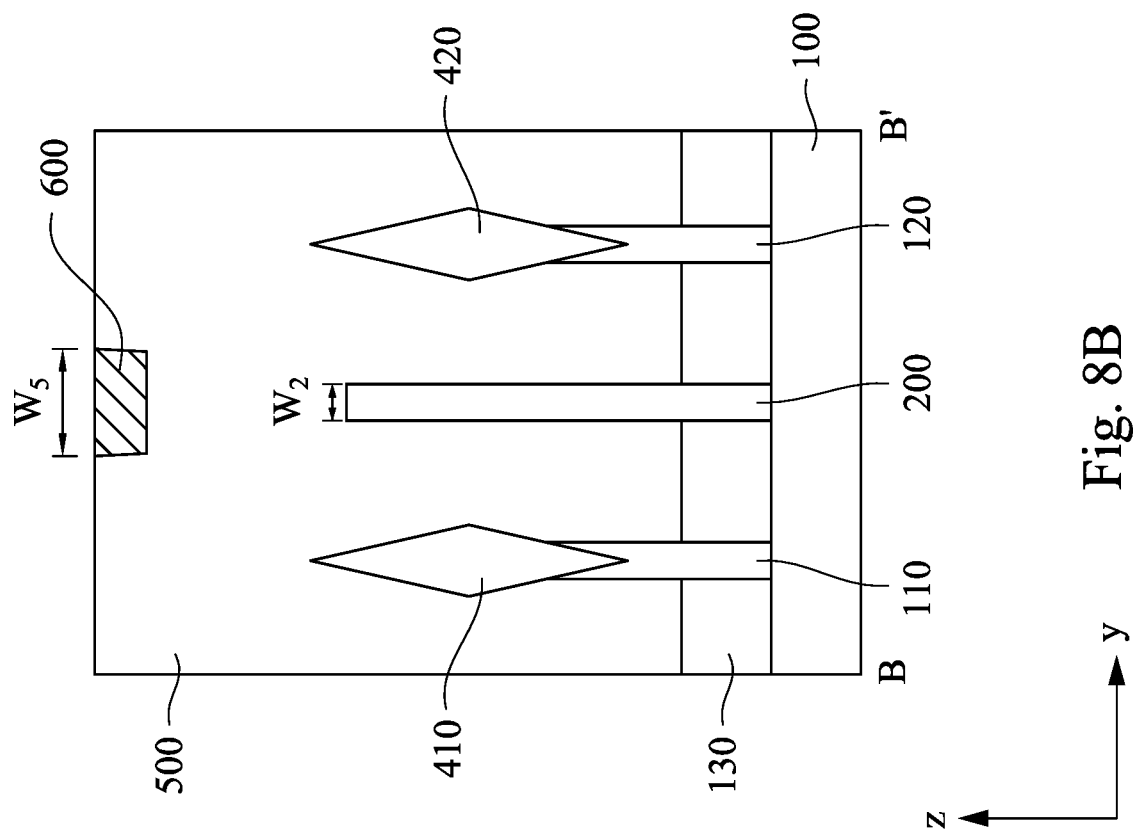
Figure 8E:
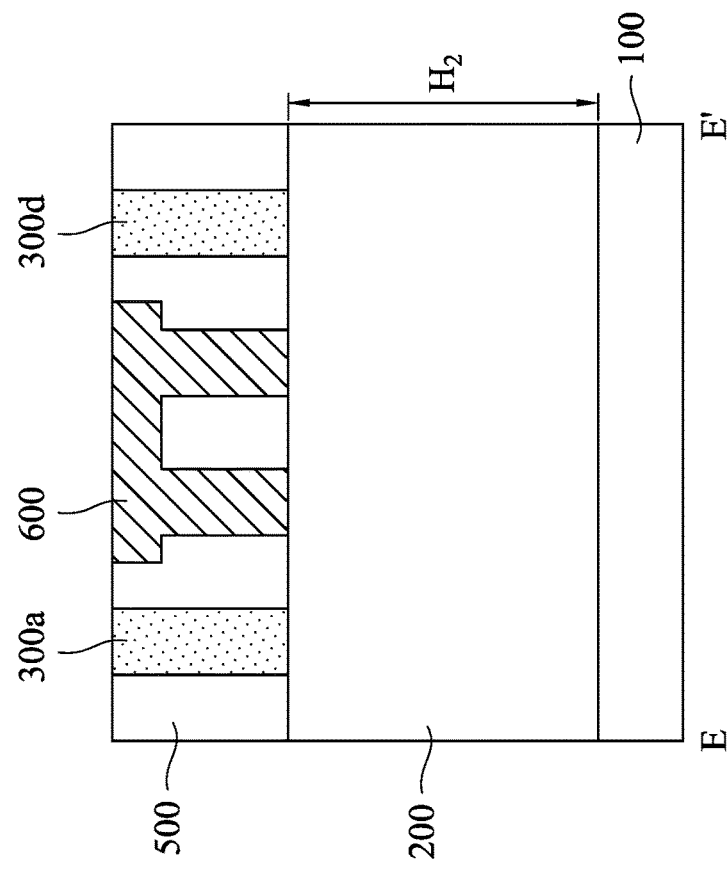
Figure 8D:
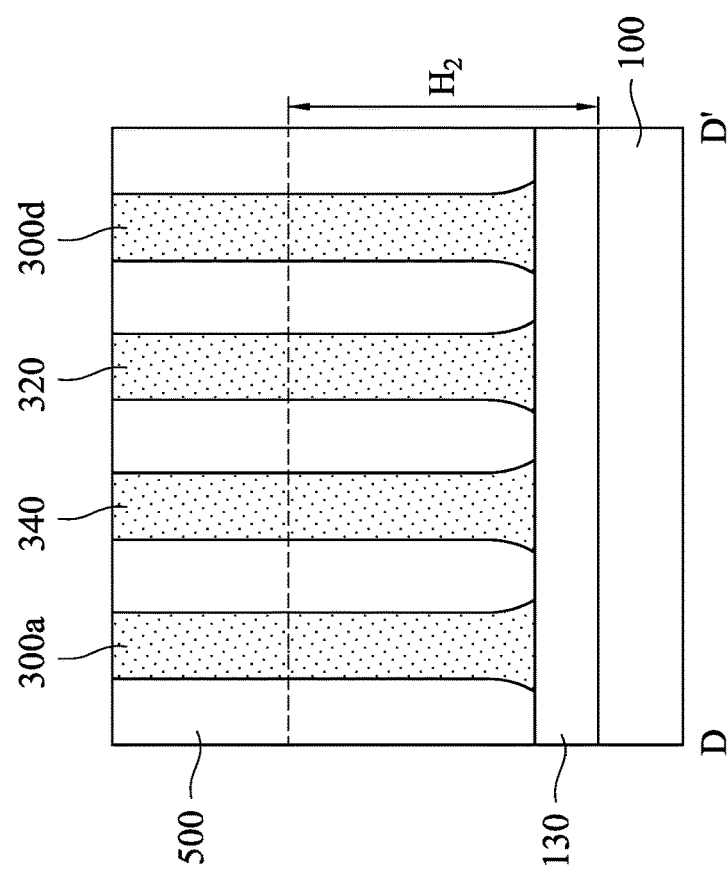
Figure 9A:
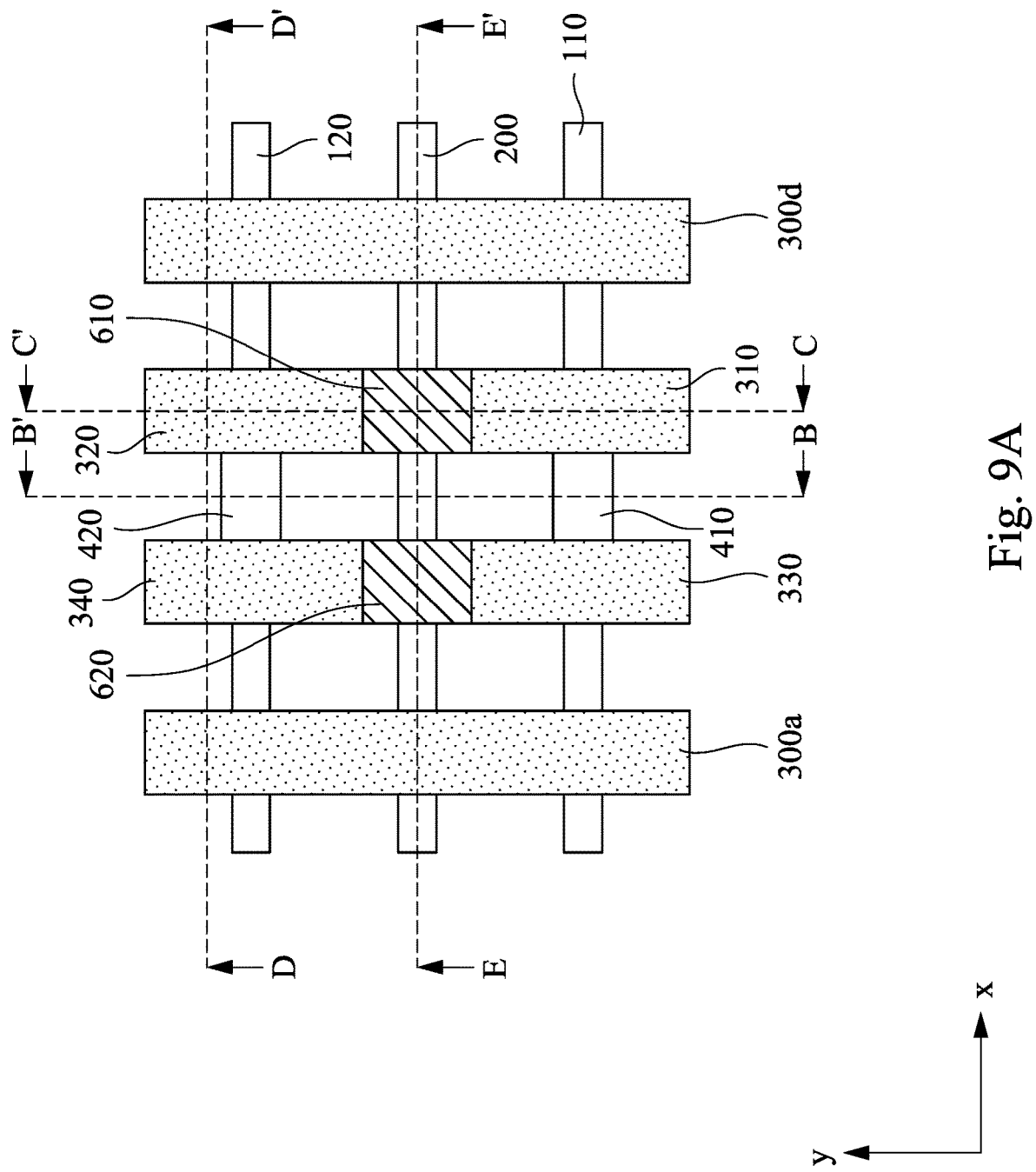
Figure 9C:
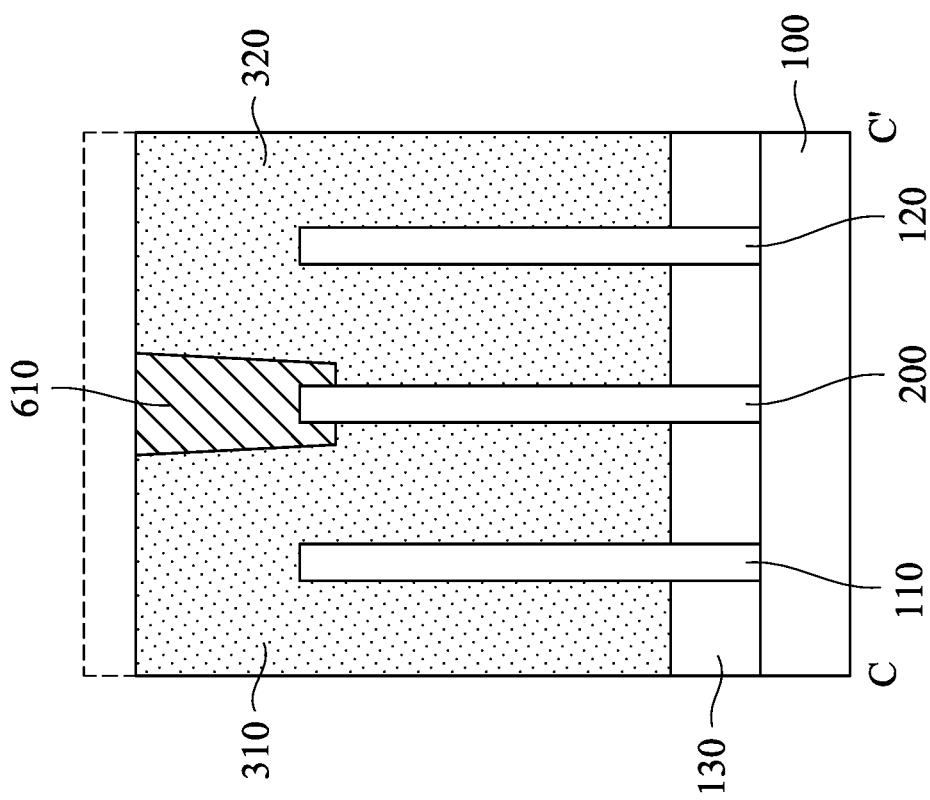
FIGS. 9B to 9E are cross-sectional views of the semiconductor device in FIG. 9A in accordance with some embodiments of the present disclosure.
Figure 9B:
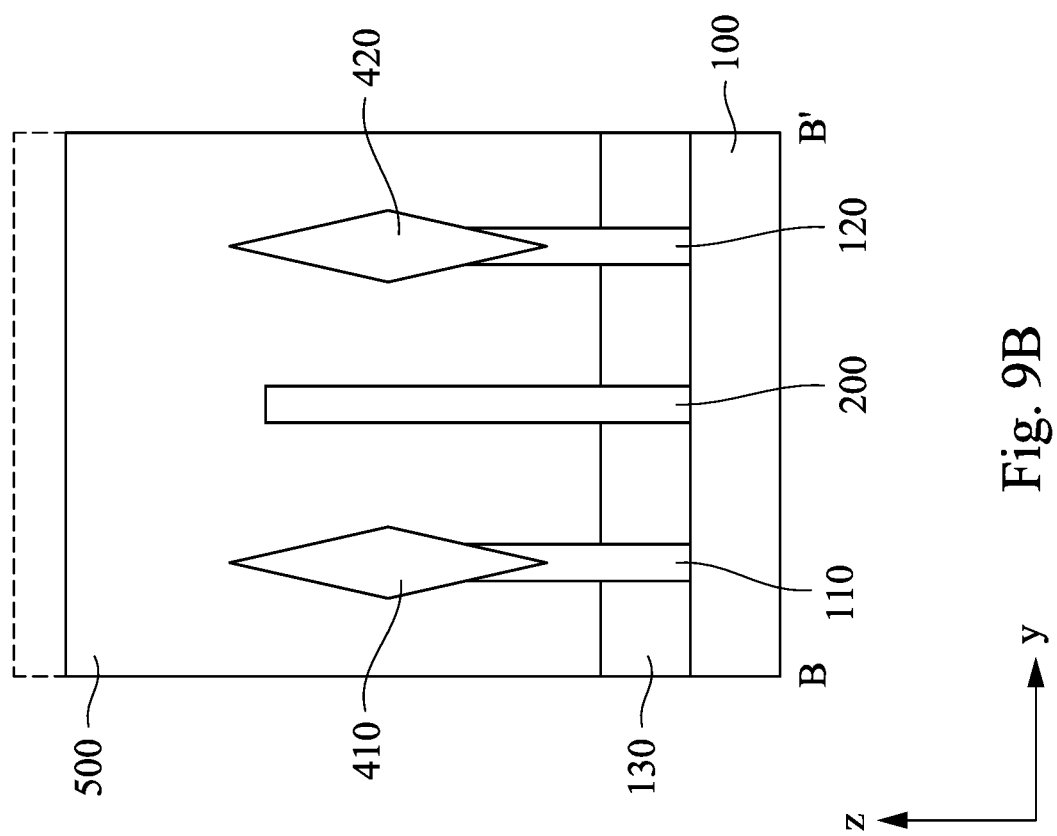
Figure 9E:
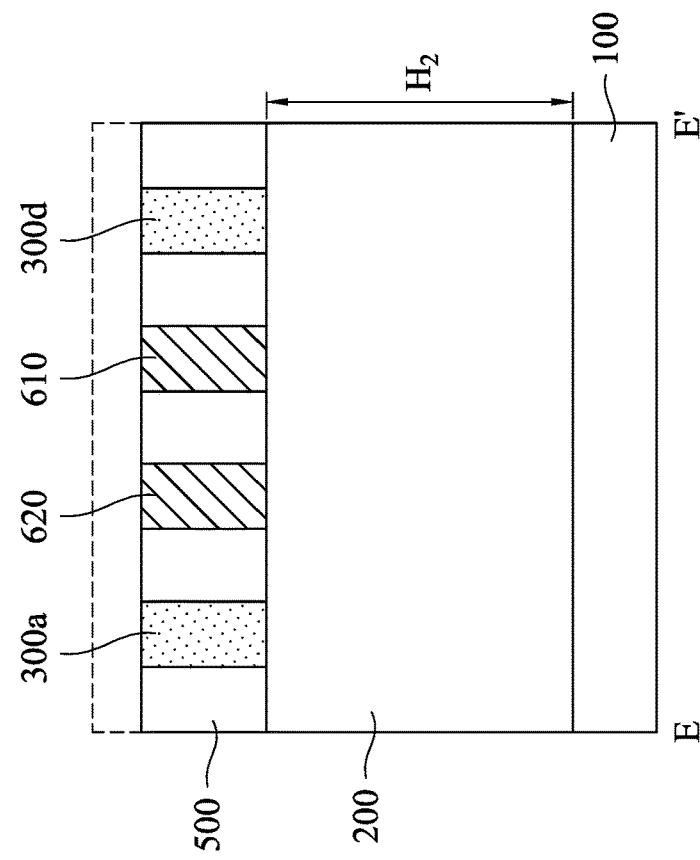
Figure 9D:
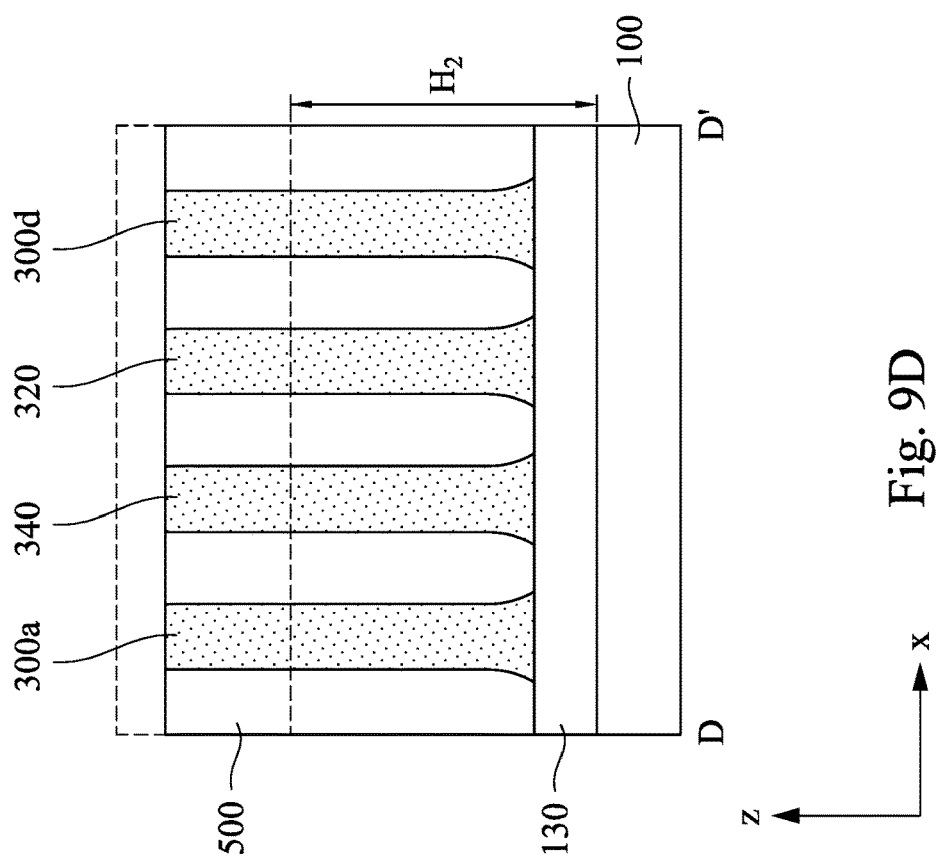

After the operation 14, the method 10 may further includes other operations or acts according to some embodiments of the present disclosure. FIG. 7 is a flowchart illustrating the operations that may be performed after operation 14 in accordance some embodiments. For example, the method 10 may optionally include operations 16, 18, 20 and 22, which are further described below. Furthermore, FIGS. 8A-10E are drawings schematically illustrating various stages after the operation 14 according to some embodiments. In FIGS. 8A-10E, figures ending with an "A" designation are illustrated a plan view, figures ending with an "B" designation are illustrated along a similar cross-section B-B', figures ending with a "C" designation are illustrated along a similar cross-section C-C', figures ending with a "D" designation are illustrated along a similar cross-section D-D', and figures ending with a "E" designation are illustrated along a similar cross-section E-E'.

In the operation 16, an insulating material is deposited in the opening 314 to form an isolation structure 600, as illustrated in FIGS. 8A-8E. In various embodiments, the insulating material may include silicon oxide, silicon nitride, silicon oxynitride, silicon oxycarbonitride, hafnium silicon oxide, zirconium silicon oxide, aluminum silicon oxide, a combination of thereof, and/or other suitable material. The opening 314 may be filled with one or more insulating material to form the isolation structure 600. Although the FIGS. 8A-8E show the isolation structure 600 is formed in the opening 314 of FIGS. 3A-3E, it should be understood that the present disclosure is not limited thereto. For example, the isolation structure 600 may be formed in the opening 314 of FIGS. 4, 5A-5C, and 6A-6C. The location and the shape of the isolation structure 600 depend on that of the opening 314 to be filled. The isolation structure 600 at least traverses the first metal gate 310 and the second metal gate 320. In specific, the isolation structure 600 and the dummy fin 200 collectively separate and isolate the first metal gate 310 from the second metal gate 320. In some embodiments, the isolation structure 600 may further traverse the third metal gate 330 and the fourth metal gate 340. Similarly, the isolation structure 600 and the dummy fin 200 collectively separate and isolate the third metal gate 330 from the fourth metal gate 340. The isolation structure 600 may be formed by CVD, PVD, ALD, or other suitable deposition method, and optionally followed by a chemical mechanical polishing process. As illustrated, the width W5 of the isolation structure 600 is substantially the same as the width W3 of the opening 314 because the isolation structure 600 is formed in the opening 134. In some embodiments, the width W5 of the isolation structure 600 is greater than the width W2 of the dummy fin 200. In other embodiments, the width W5 of the isolation structure 600 may be smaller than the width W2 of the dummy fin 200. In some embodiments, the isolation structure 600 covers portions of the opposite sidewalls 210 and 220 of the dummy fin 200.

In the operation 18, a planarization process, such as a chemical mechanical polish (CMP) process is performed to remove portions of the isolation structure 600, the first metal gate 310, the second metal gate 320, and the ILD layer 500, as illustrated in FIGS. 9A-9E. In some embodiments, the CMP process removes the excessive isolation structure 600 over the ILD layer 500, and the isolation structure 600 is then divided into a first isolation structure 610 and a second isolation structure 620. The first isolation structure 610 separates the first metal gate 310 from the second metal gate 320, and the second isolation structure 620 separates the third metal gate 330 from the fourth metal gate 340.

In the operation 20, the interlayer dielectric (ILD) layer 500 is selectively etched to form a trench 510 exposing portions of the dummy fin 200, the first epitaxial source/drain (S/D) region 410, and the second epitaxial source/drain (S/D) region 420, as illustrated in FIGS. 10A-10E. The trench 510 may has an extending direction parallel to the metal gates 300a, 300d. Further, the trench 510 at least extends from the first epitaxial source/drain (S/D) region 410 through the dummy fin 200 to the second epitaxial source/drain (S/D) region 420. Moreover, the trench 510 extends through the spacing between the first and second isolation structures 610 and 620.

Still Referring to FIGS. 10A-10E. In the operation 22, a metal wire 700 is formed in the trench 510 and interconnects the exposed portion of the first epitaxial source/drain (S/D) region 410 with the exposed portion of the second epitaxial source/drain (S/D) region 420. In various embodiments, the metal wire 700 may include conductive materials. In some embodiments, the metal wire 700 may include a barrier layer and a metal layer. In some examples, the barrier layer may include TaN, TiN, or the like. In some examples, the metal layer may include Al, Cu, W, or the like. The metal wire 700 may be formed by PVD, CVD, or other suitable method. In some embodiments, a silicide layer may be form in the trench 510 before forming the metal wire 700. As shown in FIGS. 10A-10E, the metal wire 700 traverses or crosses over the dummy fin 200, the first and the second epitaxial source/drain (S/D) region 410 and 420, and electrically connects the first and the second epitaxial source/drain (S/D) region 410 and 420.

Figure 11:
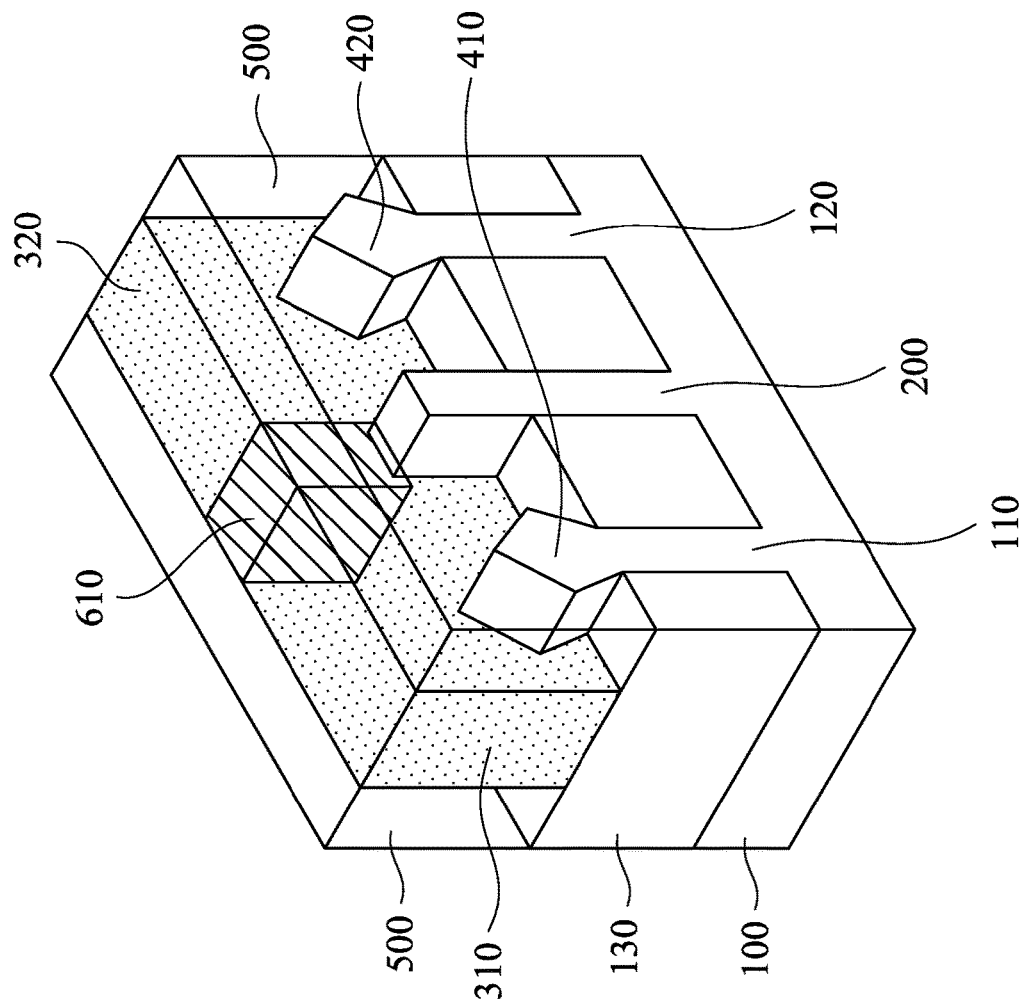
FIG. 11 is perspective view of the semiconductor device in accordance with some embodiments of the present disclosure.

Reference is made to FIG. 11, illustrating a perspective view of semiconductor device 2000 in accordance with some embodiments of the present disclosure. The semiconductor device 2000 may include a substrate 100, a first fin 110, a second fin 120, a dummy fin 200, a first metal gate 310, a second metal gate 320, a first epitaxial source/drain region 410, a second epitaxial source/drain region 420, a first isolation structure 610, and an interlayer dielectric (ILD) layer 500. The various materials for the substrate 100, the first and the second fin 110 and 120, the dummy fin 200, the first and the second metal gate 310 and 320, the first and the second epitaxial source/drain (S/D) region 410 and 420, the ILD layer 500 and the first isolation structure 610 of the semiconductor device 2000 may be the same as or similar to that discussed above with reference to FIGS. 2A-6C.

The first fin 110, the second fin 120 and the dummy fin 200 are formed on the substrate 100 and extend along the x direction, wherein the dummy fin 200 is between the first fin 110 and the second fin 120. The first metal gate 310 and the second metal gate 320 traverse or cross over the first fin 110 and the second fin 120, respectively. The first isolation structure 610 is over the dummy fin 200. More specifically, the first isolation structure 610 and the dummy fin 200 collectively separate and isolate the first metal gate 310 from the second metal gate 320. As shown in FIG. 11, the first metal gate 310, the first isolation structure 610 and the second metal gate 320 are aligned in the y direction, and the first isolation structure 610 directly contacts the first metal gate 310 and the second metal gate 320. The first epitaxial source/drain (S/D) region 410 and the second epitaxial source/drain (S/D) region 420 are on the first fin 110 and the second fin 120, respectively. The first epitaxial source/drain (S/D) region 410 is on either side of the first metal gate 310, and the second epitaxial source/drain (S/D) region 420 is on either side of the second metal gate 320. The interlayer dielectric (ILD) layer 500 covers the dummy fin 200, the first and the second epitaxial source/drain (S/D) region 410 and 420. The interlayer dielectric (ILD) layer 500 is adjacent to the first metal gate 310, the first isolation structure 610 and the second metal gate 320.

The semiconductor device 2000 may optionally include other elements, for examples, shallow trench isolation (STI) regions 130 between the first fin 110, the dummy fin 200 and the second fin 120.

Figure 10A:
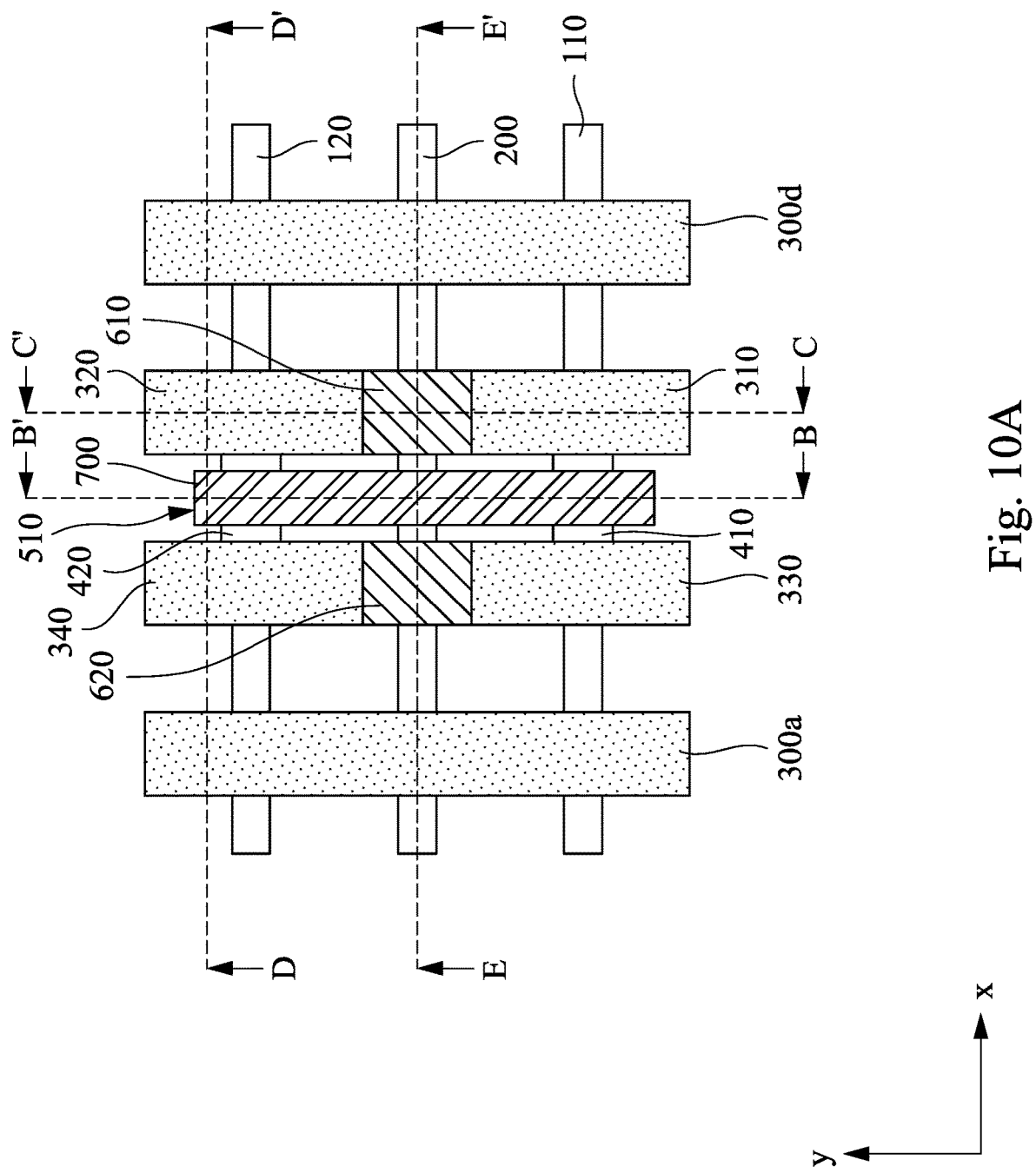

In some embodiments, as depicted in FIG. 10A, the semiconductor device 2000 may further include a third metal gate 330, a fourth metal gate 340 and a second isolation structure 620 aligned in the y direction, and next to the first metal gate 310, the second metal gate 320 and the first isolation 610. In yet some embodiments, the semiconductor device 2000 may include a metal wire 700 between the first and second isolation structure 610 and 620, connecting the first epitaxial source/drain (S/D) region 410 and the second epitaxial source/drain (S/D) region 420.

Embodiments of the present disclosure may have at least following advantages. In the method of forming a semiconductor device, during the formation of the isolation structure to separate the metal gates, etching away a portion of the metal gate on the dummy fin, which is between the first fin and the second fin, instead of etching away a portion of the metal gate down to the STI region, may be advantageous to prevent huge interlayer dielectric (ILD) layer loss. Moreover, because only etching away a portion of the metal gate over the dummy fin (or further etching away the top portion of the dummy fin), no additional etching process is needed to deal with the metal gate residue around the bottom of the first and the second fin (e.g., metal gate footing). Therefore, the width of the isolation structure may be more easily to shrink achieving an expected chip density. In addition, in the subsequent process of forming a metal wire to electrically connect the first and the second epitaxial source/drain regions, only a small amount of the excessive isolation structure need to be removed, preventing the damage of the first and second epitaxial source/drain region.

According to some embodiments, a method for manufacturing a semiconductor device includes providing a structure including a substrate, a first fin, a second fin, and a dummy fin between the first fin and the second fin on the substrate, a metal gate over the substrate and traversing the first fin, the dummy fin, and the second fin, wherein the metal gate has a portion overlapped with the dummy fin, a first and a second epitaxial source/drain (S/D) region on the first and the second fin respectively, and an interlayer dielectric (ILD) layer over the first and the second epitaxial source/drain (S/D) region; and etching away the portion of the metal gate overlapped with the dummy fin to cut off the metal gate, thereby forming an opening exposing the dummy fin.

According to some embodiments, etching away the portion of the metal gate overlapped with the dummy fin includes removing a top portion of the dummy fin.

According to some embodiments, the opening has a width that is greater than a width of the dummy fin.

According to some embodiments, the opening exposes a portion of opposite sidewalls of the dummy fin.

According to some embodiments, the opening has a width that is smaller than a width of the dummy fin.

According to some embodiments, the opening exposes a portion of a sidewall of the dummy fin.

According to some embodiments, the method further comprises depositing an insulating material in the opening to form an isolation structure.

According to some embodiments, the method further comprises performing a chemical mechanical polish (CMP) process to remove a portion of the isolation structure; selectively etching the interlayer dielectric (ILD) layer to form a trench exposing a portion of the dummy fin, a portion of the first epitaxial source/drain (S/D) region, and a portion of the second epitaxial source/drain (S/D) region, wherein the trench extends in a direction parallel to an extending direction of the metal gate; and forming a metal wire in the trench and interconnecting the exposed portion of the first epitaxial source/drain (S/D) region with the exposed portion of the second epitaxial source/drain (S/D) region.

According to some embodiments, a semiconductor device includes a first fin, a second fin and a dummy fin on a substrate, wherein the dummy fin is disposed between the first fin and the second fin, a first metal gate over the first fin and a second metal gate over the second fin, and an isolation structure on the dummy fin, wherein the dummy fin and the isolation structure separates the first and the second metal gate.

According to some embodiments, the isolation structure covers a portion of at least one sidewall of the dummy fin.

According to some embodiments, the isolation structure has a width that is greater than a width of the dummy fin.

According to some embodiments, the isolation structure has a width that is smaller than a width of the dummy fin.

According to some embodiments, a semiconductor device includes a first fin, a second fin, and a dummy fin on the substrate and extending along a first direction, wherein the dummy fin is disposed between the first and the second fin, a first and a second metal gate respectively on the first and the second fin, a first isolation structure over the dummy fin and between the first and the second metal gate, wherein the first isolation structure, the first and the second metal gate are aligned in a second direction, which is perpendicular to the first direction, a first and a second epitaxial source/drain (S/D) region respectively on the first and the second fin, and an interlayer dielectric (ILD) layer over the first and the second epitaxial source/drain (S/D) region.

According to some embodiments, the dummy fin comprises SiO, SiN, SiON, SiOCN, hafnium silicon oxide, zirconium silicon oxide, aluminum silicon oxide, or a combination of thereof.

According to some embodiments, the first isolation structure has a width that is greater than a width of the dummy fin.

According to some embodiments, the first isolation structure overlaps a portion of opposite sidewalls of the dummy fin.

According to some embodiments, the first isolation structure has a width that is smaller than a width of the dummy fin.

According to some embodiments, the first isolation structure overlaps a portion of a sidewall of the dummy fin.

According to some embodiments, the semiconductor device further comprises a third metal gate on the first fin and a fourth metal gate on the second fin; and a second isolation structure on the dummy fin and between the third and the fourth metal gate, wherein the second isolation structure is next to the first isolation structure, and the second isolation structure, the third and the fourth metal gate are aligned in the second direction.

According to some embodiments, the semiconductor device further comprises a metal wire traversing the dummy fin, the first and the second epitaxial source/drain (S/D) region, wherein the metal wire is disposed between the first and the second isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first fin, a second fin and a dummy fin arranged on a substrate along a first direction, wherein the dummy fin is disposed between the first fin and the second fin;
   a first epitaxial source/drain region over the first fin;
   a first metal gate over the first fin and a second metal gate over the second fin;
   an isolation structure on the dummy fin, wherein the dummy fin and the isolation structure separate the first and the second metal gate; and
   a metal wire in direct contact with a top surface and opposite sidewalls of the dummy fin and extending over the first epitaxial source/drain region along the first direction.

2. The semiconductor device of claim 1, wherein the isolation structure covers a portion of at least one sidewall of the dummy fin.

3. The semiconductor device of claim 1, wherein the isolation structure has a width that is greater than a width of the dummy fin.

4. A semiconductor device comprising:
a first fin, a second fin, and a dummy fin on a substrate and extending along a first direction, wherein the dummy fin is disposed between the first and the second fins;
a first and a second metal gate respectively on the first and the second fins;
a third and a fourth metal gate respectively on the first and second fins;
a first isolation structure over the dummy fin and between the first and the second metal gate, wherein the first isolation structure, the first and the second metal gate are aligned in a second direction, which is perpendicular to the first direction;
a second isolation structure over the dummy fin and between the third and the fourth metal gate, wherein the second isolation structure is next to the first isolation structure, and the second isolation structure, the third and the fourth metal gate are aligned in the second direction;
a first and a second epitaxial source/drain (S/D) region respectively on the first and the second fin;
an interlayer dielectric (ILD) layer over the first and the second epitaxial source/drain (S/D) region; and
a metal wire in contact with a top surface of the dummy fin, wherein the metal wire is laterally between the first isolation structure and the second isolation structure along the first direction, and wherein a bottommost surface of the metal wire is higher than a bottommost surface of the first metal gate.

5. The semiconductor device of claim 4, wherein the dummy fin comprises SiO, SiN, SiON, SiOCN, hafnium silicon oxide, zirconium silicon oxide, aluminum silicon oxide, or a combination of thereof.

6. The semiconductor device of claim 4, wherein the first isolation structure has a width that is greater than a width of the dummy fin.

7. The semiconductor device of claim 6, wherein the first isolation structure overlaps a portion of opposite sidewalls of the dummy fin.

8. The semiconductor device of claim 4, wherein the first isolation structure overlaps a portion of a sidewall of the dummy fin.

9. A semiconductor device comprising:
a first semiconductor fin and a second semiconductor fin on a substrate;
a dummy fin disposed on the substrate and between the first semiconductor fin and the second semiconductor fin;
a first metal gate crossing the first semiconductor fin and a second metal gate crossing the second semiconductor fin;
an isolation structure on and overlapped with the dummy fin, wherein the isolation structure is aligned with the first metal gate and the second metal gate along a lengthwise direction of the first metal gate and the second metal gate, wherein the dummy fin and the isolation structure separates the first metal gate from the second metal gate, and wherein along the lengthwise direction of the first metal gate and the second metal gate, the isolation structure is closer to the second semiconductor fin than to the first semiconductor fin, and the first metal gate extends to a top surface of the dummy fin;
an interlayer dielectric (ILD) layer adjacent to the isolation structure; and
a metal wire in the ILD layer.

10. The semiconductor device of claim 9, wherein the isolation structure has a width that is greater than a width of the dummy fin.

11. The semiconductor device of claim 9, wherein the isolation structure overlaps a portion of a sidewall of the dummy fin.

12. The semiconductor device of claim 9, wherein the isolation structure overlaps a portion of opposite sidewalls of the dummy fin.

13. The semiconductor device of claim 9, wherein the isolation structure has a bottom surface coplanar with a top surface of the dummy fin.

14. The semiconductor device of claim 9, further comprising a plurality of epitaxial source/drain (S/D) region respectively on the first and second semiconductor fins.

15. The semiconductor device of claim 9, further comprising a metal wire crossing the first and second semiconductor fins and the dummy fin.

16. The semiconductor device of claim 9, wherein a bottom surface of the isolation structure is lower than a top surface of the dummy fin, and is in contact with the first and second metal gates.

17. The semiconductor device of claim 1, wherein the isolation structure covers at least three sides of the dummy fin.

18. The semiconductor device of claim 1, wherein a top surface of the metal wire is substantially level with a top surface of the first metal gate, and a bottommost surface of the metal wire is higher than a bottommost surface of the first metal gate.

19. The semiconductor device of claim 9, wherein a bottommost surface of the metal wire is higher than a bottommost surface of the first metal gate.

20. The semiconductor device of claim 9, wherein the metal wire is in direct contact with a top surface and opposite sidewalls of the dummy fin.

* * * * *